United States Patent
Shin et al.

(10) Patent No.: US 12,433,075 B2
(45) Date of Patent: Sep. 30, 2025

(54) DISPLAY DEVICE

(71) Applicant: LG DISPLAY CO., LTD., Seoul (KR)

(72) Inventors: Jungcheol Shin, Seoul (KR); SungKi Kim, Goyang-si (KR); GiSang Hong, Seoul (KR); YoungWook Lee, Paju-si (KR)

(73) Assignee: LG Display Co., Ltd (KR)

( * ) Notice: Subject to any disclaimer, the term of this patent is extended or adjusted under 35 U.S.C. 154(b) by 564 days.

(21) Appl. No.: 17/873,575

(22) Filed: Jul. 26, 2022

(65) Prior Publication Data

US 2023/0082560 A1 Mar. 16, 2023

(30) Foreign Application Priority Data

Sep. 3, 2021 (KR) .......... 10-2021-0117591
Sep. 3, 2021 (KR) .......... 10-2021-0117610
Dec. 24, 2021 (KR) .......... 10-2021-0187158

(51) Int. Cl.
| | |
|---|---|
| H01L 33/56 | (2010.01) |
| H01L 33/62 | (2010.01) |
| H10H 20/854 | (2025.01) |
| H10H 20/857 | (2025.01) |

(52) U.S. Cl.
CPC ........ *H10H 20/854* (2025.01); *H10H 20/857* (2025.01)

(58) Field of Classification Search
CPC .. H10H 20/854; H10H 20/857; H10K 59/124; H01L 25/167
USPC ........................................... 257/473
See application file for complete search history.

(56) References Cited

U.S. PATENT DOCUMENTS

2021/0013243 A1* 1/2021 Li .................. H10K 59/32
2021/0202910 A1* 7/2021 Lee ............... H10K 59/1213

FOREIGN PATENT DOCUMENTS

KR 20210084835 A 7/2021

OTHER PUBLICATIONS

Office Action in Korean Appln. No. 10-2021-0187158, mailed on Jun. 12, 2025, 15 pages (with English translation).

* cited by examiner

*Primary Examiner* — Tong-Ho Kim
(74) *Attorney, Agent, or Firm* — Fish & Richardson P.C.

(57) ABSTRACT

A display device includes a transistor disposed over a substrate, a planarization layer disposed over the transistor, a light-emitting element disposed over the planarization layer; and a plurality of insulating layers disposed between the substrate and the light-emitting element, and at least one of the planarization layer and the plurality of insulating layers is a hydrogen blocking layer doped with a hydrogen capture material.

15 Claims, 31 Drawing Sheets

DISPLAY DEVICE

CROSS-REFERENCE TO RELATED APPLICATION

This application claims the priorities of Korean Patent Application No. 10-2021-0117591 filed on Sep. 3, 2021, Korean Patent Application No. 10-2021-0117610 filed on Sep. 3, 2021, and Korean Patent Application No. 10-2021-0187158 filed on Dec. 24, 2021, which are hereby incorporated by reference in their entirety.

BACKGROUND

Field of the Disclosure

The present disclosure relates to a display device, and more particularly, to a display device capable of inhibiting degradation by improving reliability of a transistor.

Description of the Background

Recently, display devices, which visually display electrical information signals, are being rapidly developed in accordance with the full-fledged entry into the information era. Various studies are being continuously conducted to develop a variety of display devices which are thin and lightweight, consume low power, and have improved performance.

Among the various display devices, a light-emitting display device refers to a display device that autonomously emits light. Unlike a liquid crystal display device, the light-emitting display device does not require a separate light source and thus may be manufactured as a lightweight, thin display device. In addition, the light-emitting display device is advantageous in terms of power consumption because the light-emitting display device operates at a low voltage. Further, the light-emitting display device is expected to be adopted in various fields because the light-emitting display device is also excellent in implementation of colors, response speeds, viewing angles, and contrast ratios (CRs).

SUMMARY

Accordingly, the present disclosure is to provide a display device capable of inhibiting diffusion of hydrogen generated from an encapsulation unit.

The present disclosure is also to provide a display device capable of inhibiting degradation by improving reliability of a transistor.

Further, the present disclosure is to provide a display device capable of reducing resistance by increasing an area of a line.

The present disclosure is not limited to the above-mentioned and other features, which are not mentioned above, can be clearly understood by those skilled in the art from the following descriptions.

According to an aspect of the present disclosure, a display device includes a transistor disposed over a substrate; a planarization layer disposed over the transistor; a light-emitting element disposed over the planarization layer; and a plurality of insulating layers disposed between the substrate and the light-emitting element, and at least one of the planarization layer and the plurality of insulating layers is a hydrogen blocking layer doped with a hydrogen capture material.

According to the present disclosure, the hydrogen blocking layer may minimize diffusion of hydrogen to the transistor.

The present disclosure can improve quality of the display device by inhibiting degradation of the transistor.

The present disclosure can improve brightness deviation by reducing resistance of the line.

The effects according to the present disclosure are not limited to the contents exemplified above, and more various effects are included in the present specification.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
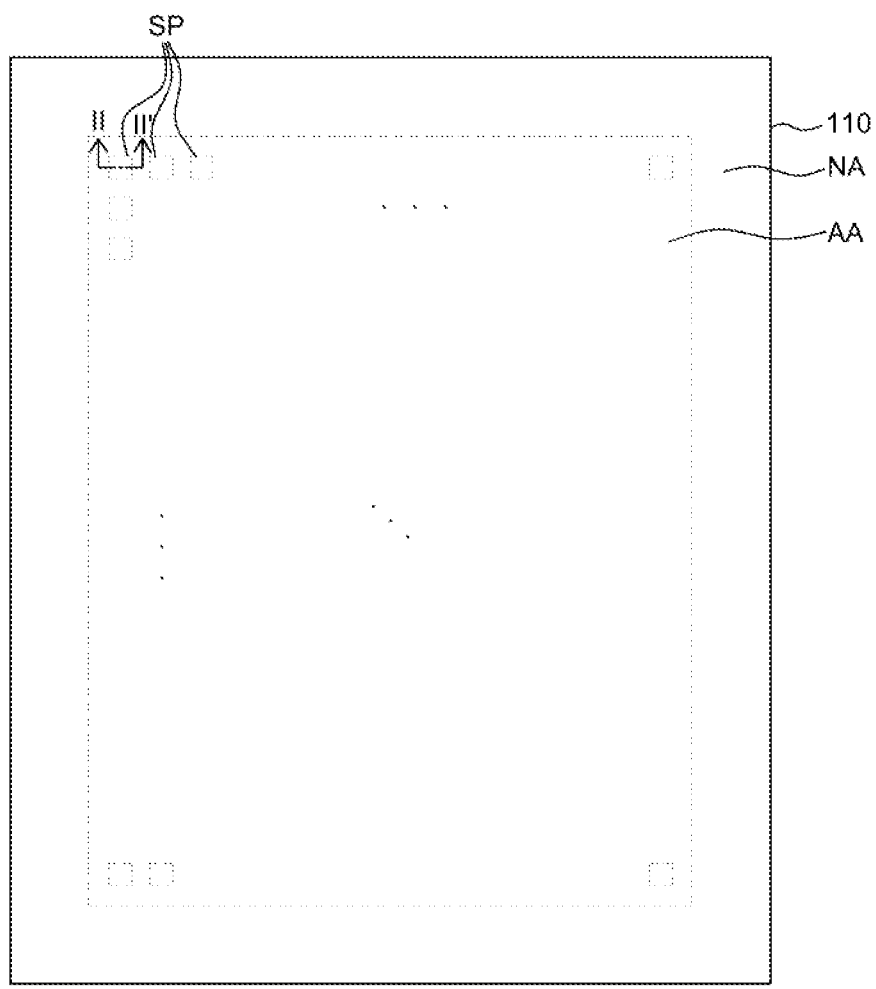
FIG. 1 is a top plan view of a display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

FIG. 1 is a top plan view of a display device according to an aspect of the present disclosure.

Referring to FIG. 1, a display device 100 according to an aspect of the present disclosure includes a display area AA and a non-display area NA.

The display area AA may be disposed at a central portion of a substrate 110. The display area AA may be an area of the display device 100 in which images are displayed. Various display elements and various driving elements for operating the display elements may be disposed in the display area AA. For example, the display element may be configured as a light-emitting element 150 including a first electrode 151, a light-emitting layer 152, and a second electrode 153 which will be described below. In addition, various driving elements such as a transistor 130, a capacitor, lines, and the like, which are configured to operate the display elements, may be disposed in the display area AA.

A plurality of subpixels SP may be included in the display area AA. The subpixel SP is a minimum unit that constitutes a screen. The plurality of subpixels SP may each include the light-emitting element 150 and a drive circuit. The plurality of subpixels SP may each be defined as an area in which a plurality of gate lines disposed in a first direction and a plurality of data lines disposed in a second direction different from the first direction intersect each other. In this case, the first direction may be a horizontal direction based on FIG. 1, and the second direction may be a vertical direction based on FIG. 1. However, the present disclosure is not limited thereto. The plurality of subpixels SP may emit light beams having different wavelengths. For example, the plurality of subpixels SP may include red subpixels, green subpixels, and blue subpixels. In addition, the plurality of subpixels SP may further include white subpixels.

The drive circuit of the subpixel SP is a circuit for controlling an operation of the light-emitting element 150. For example, the drive circuit may include a switching transistor, a driving transistor, a capacitor, and the like. The drive circuit may be electrically connected to signal lines such as gate lines and data lines connected to gate drivers and data drivers disposed in the non-display area NA.

The non-display area NA may be disposed in a peripheral area of the substrate 110. The non-display area NA may be an area in which no image is displayed. The non-display area NA may be disposed to surround the display area AA, but the present disclosure is not limited thereto. Various constituent elements for operating the plurality of subpixels SP disposed in the display area AA may be disposed in the non-display area NA. For example, drive ICs, drive circuits, signal lines, flexible films, and the like, which are configured to supply signals for operating the plurality of subpixels SP, may be disposed. In this case, the drive IC may include a gate driver, a data driver, and the like.

Figure 2:
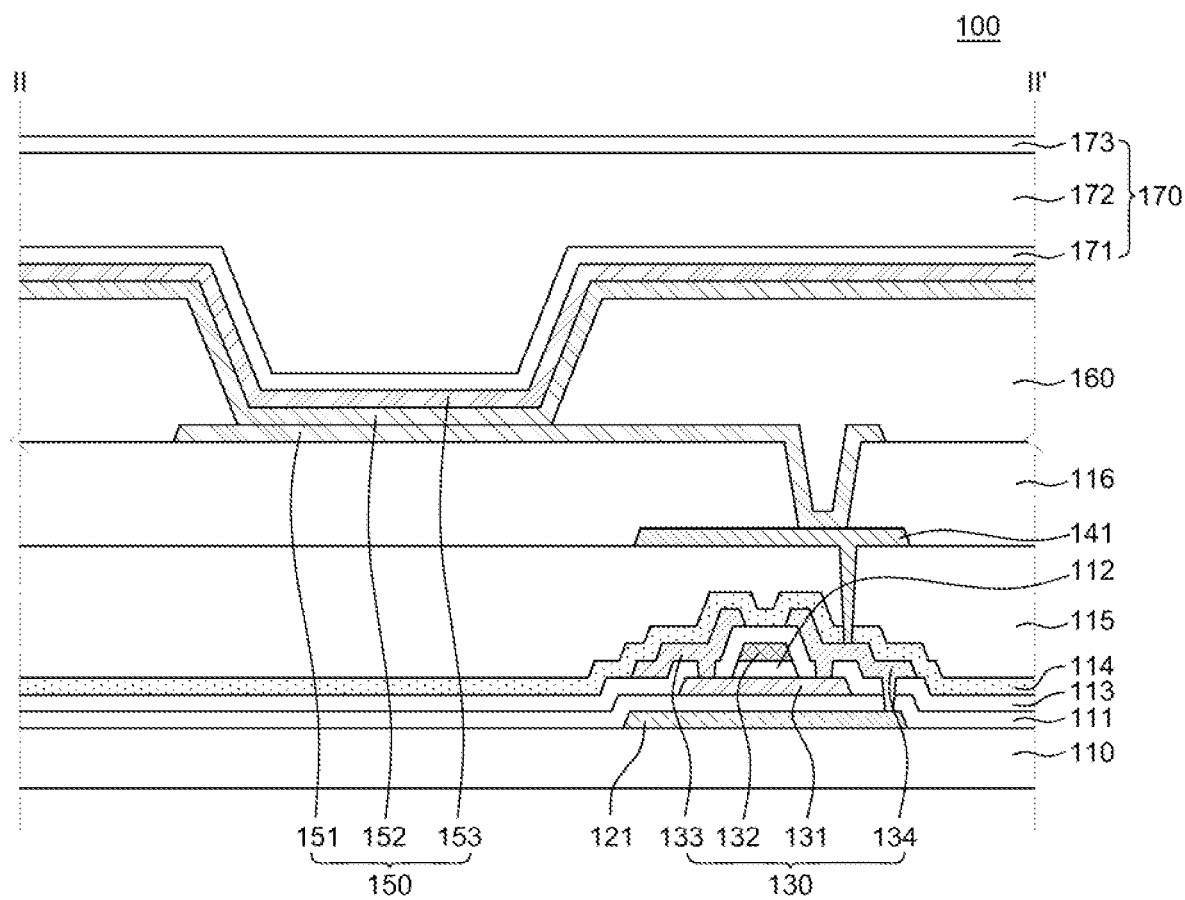
FIG. 2 is a cross-sectional view taken along line in FIG. 1.

FIG. 2 is a cross-sectional view taken along line II-II' in FIG. 1.

Referring to FIG. 2, the display device 100 includes the substrate 110, a protective layer 121, a transistor 130, a hydrogen blocking layer 114, a connection electrode 141, planarization layers 115 and 116, a light-emitting element 150, a bank 160, and an encapsulation unit 170. The display device 100 may be implemented as a top-emission type display device, but the present disclosure is not limited thereto.

The substrate 110 is a substrate configured to support and protect several constituent elements of the display device 100. The substrate 110 may be made of glass or a plastic material having flexibility. In the case in which the substrate 110 is made of a plastic material, the substrate 110 may be made of polyimide (PI), for example. However, the present disclosure is not limited thereto.

The protective layer 121 is disposed on the substrate 110. The protective layer 121 may be disposed to overlap with the transistor 130. The protective layer 121 may be made of a metallic material and electrically connected to a source electrode 133 or a drain electrode 134 of the transistor 130. However, the present disclosure is not limited thereto. For example, the protective layer 121 may be made of molybdenum (Mo) and electrically connected to the drain electrode 134. However, the present disclosure is not limited thereto. The protective layer 121 may be selectively formed only in a necessary area. For example, the protective layer 121 may be disposed to overlap with the transistor 130 that serves as a driving transistor. However, the present disclosure is not limited thereto. That is, the protective layer 121 may also be disposed below another transistor other than the driving transistor.

The protective layer 121 may suppress the occurrence of potential on a surface of the substrate 110 and block an inflow of light from the outside. Specifically, in a case in which the substrate 110 is made of a plastic material, a separate support substrate is attached to a lower portion of the substrate 110 to support the substrate 110 during the manufacturing process. In this case, a sacrificial layer is disposed between the substrate 110 and the support substrate. When the manufacturing process is completed, the substrate 110 and the support substrate may be separated by a laser release process. An active layer 131 of the transistor 130 disposed over the substrate 110 may be damaged by laser beams emitted during the laser release process.

In addition, a sensor using infrared rays or the like may be disposed below the display device 100. Therefore, the active layer 131 may be degraded by light generated from the sensor.

In addition, a threshold voltage (Vth) of the transistor 130 may be shifted because of an electric current drop generated by the substrate 110 and the sacrificial layer. Specifically, a negative charge trap may occur at the sacrificial layer because of laser beams and light introduced from the outside. Further, positive (+) charges in the plastic material, for example, polyimide (PI), which is a material of the substrate 110, may move toward the sacrificial layer. Therefore, potential at the surface of the substrate 110 may increase. As a result, the threshold voltage of the transistor 130 is shifted in a positive direction, and the current flowing through the transistor 130 may decrease. The shift of the threshold voltage deteriorates reliability of the display device 100.

Therefore, the substrate 110 may produce heat when the display device 100 operates after the laser release process. As a result, charged particles generated at the substrate 110 move upward. The charged particles affect the active layer 131 of the transistor 130, which may degrade reliability of the display device 100.

Therefore, the protective layer 121 may be disposed below the transistor 130. In this case, the protective layer 121 may overlap with the active layer 131. In particular, the protective layer 121 may be disposed to overlap with a channel area of the active layer 131. The protective layer 121 may inhibit the channel area from being degraded by the emitted light. In addition, the protective layer 121 may protect the transistor 130 from the charged particles generated on the substrate 110 and minimize the influence on the electric charges flowing through a channel of the transistor 130. Therefore, it is possible to cope with the shift of threshold voltage and the current drop of the transistor 130 and improve reliability of the display device 100.

Since the protective layer 121 is made of a metallic material, the protective layer 121 and the active layer 131 may be elements for forming capacitance in some instances. In this case, when the protective layer 121 electrically floats, the parasitic capacitance may be changed, and the amount of shift of threshold voltage of the transistor 130 may be diversified. This may cause a visual defect such as a change in brightness. Therefore, since the protective layer 121 is electrically connected to the source electrode 133 or the drain electrode 134, the parasitic capacitance may be kept constant. That is, the protective layer 121 may be supplied with the same voltage as the source electrode 133 or the drain electrode 134.

A buffer layer 111 is disposed on the substrate 110 and the protective layer 121. The buffer layer 111 may reduce the amount of moisture or impurities penetrating through the substrate 110. In addition, the buffer layer 111 may protect the transistor 130 from impurities such as alkaline ions flowing out of the substrate 110. Therefore, the buffer layer 111 may improve bonding forces between the substrate 110 and the layers formed over an upper portion of the buffer layer 111. The buffer layer 111 may be configured as a single layer made of silicon nitride (SiNx) or silicon oxide (SiOx) or a multilayer made of silicon nitride (SiNx) or silicon oxide (SiOx). However, the present disclosure is not limited thereto. The buffer layer 111 is not an essential constituent element. The buffer layer 111 may be eliminated depending on the type and material of the substrate 110, the structure and type of the transistor 130, and the like. Meanwhile, the buffer layer may also be disposed between the substrate 110 and the protective layer 121 in some instances.

The transistor 130 is disposed on the buffer layer 111. The transistor 130 may be used as a driving element for operating the light-emitting element 150 in the display area AA. The transistor 130 includes the active layer 131, a gate electrode 132, the source electrode 133, and the drain electrode 134. The transistor 130 illustrated in FIG. 2 is a driving transistor. The transistor 130 is a thin-film transistor having a top-gate structure in which the gate electrode 132 is disposed over the active layer 131. However, the present disclosure is not limited thereto. The transistor 130 may be implemented as a transistor having a bottom-gate structure.

FIG. 2 illustrates only the driving transistor 130 among various transistors included in the display device 100. However, the other transistors such as a switching transistor may be disposed.

Meanwhile, according to the display device 100 according to the aspect of the present disclosure, at least two types of thin-film transistors may be formed over the same substrate 110. However, the present disclosure is not limited thereto. A LTPS thin-film transistor may be a thin-film transistor that uses low-temperature polysilicon (LTPS) as the active layer. A oxide semiconductor thin-film transistor may be a thin-film transistor that uses an oxide semiconductor material as the active layer. The display device 100 according to the present disclosure may provide an optimal function as the LPTS thin-film transistor and the oxide semiconductor thin-film transistor, which have different properties, are disposed at the same substrate. FIG. 2 illustrates only the driving transistor 130. The present disclosure will be described with reference to the configuration in which the transistor 130 is the oxide semiconductor thin-film transistor. In this case, the display device 100 may include both the LPTS thin-film transistor and the oxide semiconductor thin-film transistor as described above. The display device 100 may include only the oxide semiconductor thin-film transistor.

The active layer 131 is disposed on the buffer layer 111. The active layer 131 has an area in which a channel is formed when the transistor 130 operates. Since the transistor 130 is the oxide semiconductor thin-film transistor, the active layer 131 may be made of an oxide semiconductor. However, in the case in which the transistor 130 is the LTPS thin-film transistor, the active layer 131 may be made of low-temperature polysilicon.

A gate insulating layer 112 is disposed on the active layer 131. The gate insulating layer 112 is a layer for electrically insulating the active layer 131 and the gate electrode 132. The gate insulating layer 112 may be made of an insulating material. As illustrated in FIG. 2, the gate insulating layer 112 may be formed on the active layer 131, patterned to have the same width as the gate electrode 132. However, the present disclosure is not limited thereto. The gate insulating layer 112 may be configured as a single layer made of silicon nitride (SiNx) or silicon oxide (SiOx) that is an inorganic material. Alternatively, the gate insulating layer 112 may be configured as a multilayer made of silicon nitride (SiNx) or silicon oxide (SiOx). However, the present disclosure is not limited thereto.

The gate electrode 132 is disposed on the gate insulating layer 112. The gate electrode 132 is disposed on the gate insulating layer 112 and overlaps with the channel area of the active layer 131. The gate electrode 132 may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the gate electrode 132 may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

An interlayer insulating layer 113 is disposed on the gate electrode 132. The interlayer insulating layer 113 may be configured as a single layer made of silicon nitride (SiNx) or silicon oxide (SiOx) that is an inorganic material. Alternatively, the interlayer insulating layer 113 may be configured as a multilayer made of silicon nitride (SiNx) or silicon oxide (SiOx). However, the present disclosure is not limited thereto. The interlayer insulating layer 113 has contact holes through which the source electrode 133 and the drain electrode 134 are in contact with a source area and a drain area of the active layer 131, respectively.

The source electrode 133 and the drain electrode 134 are disposed on the interlayer insulating layer 113. The source electrode 133 and the drain electrode 134 are disposed on the same layer and spaced apart from each other. The source electrode 133 and the drain electrode 134 are electrically connected to the active layer 131 through the contact holes of the interlayer insulating layer 113. The source electrode 133 and the drain electrode 134 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the source electrode 133 and the drain electrode 134 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The hydrogen blocking layer 114 is disposed to overlay the transistor 130 and the interlayer insulating layer 113. That is, the hydrogen blocking layer 114 may be a passivation layer that protects the transistor 130 and the interlayer insulating layer 113. The hydrogen blocking layer 114 may be formed by doping an insulating material layer with a hydrogen capture material. In this case, the hydrogen capture material means a material capable of capturing hydrogen by being combined with hydrogen when the material meets hydrogen. The hydrogen blocking layer 114 may completely overlay the transistor 130 and be formed over the entire surface of the substrate 110. Therefore, the hydrogen blocking layer 114 may inhibit diffusion of hydrogen produced from the encapsulation unit 170 and minimize degradation of the transistor 130 caused by hydrogen. Meanwhile, a thickness of the hydrogen blocking layer 114 may be 300 Å to 7,000 Å. In addition, a concentration of the hydrogen capture material in the hydrogen blocking layer 114 may be 10% or less.

The insulating material layer of the hydrogen blocking layer 114 may be configured as a single layer or multilayer made of silicon nitride (SiNx) or silicon oxide (SiOx) or a multilayer made of silicon nitride (SiNx) or silicon oxide (SiOx). In particular, the hydrogen blocking layer 114 may be made of, but not limited to, silicon dioxide ($SiO_2$). The hydrogen capture material of the hydrogen blocking layer 114 may include one of boron (B), phosphorus (P), lithium (Li), sodium (Na), potassium (K), rubidium (Rb), cesium (Cs), magnesium (Mg), calcium (Ca), strontium (Sr), barium (Ba), scandium (Sc), yttrium (Y), lutetium (Lu), titanium (Ti), zirconium (Zr), hafnium (Hf), vanadium (V), niobium (Nb), tantalum (Ta), lanthanum (La), cerium (Ce), thorium (Th), praseodymium (Pr), protactinium (Pa), neodymium (Nd), uranium (U), neptunium (Np), samarium (Sm), plutonium (Pu), americium (Am), gadolinium (Gd), terbium (Tb), dysprosium (Dy), holmium (Ho), erbium (Er), thulium (Tm), and ytterbium (Yb).

The planarization layers 115 and 116 are disposed over the transistor 130 and the hydrogen blocking layer 114. The planarization layers 115 and 116 may include a first planarization layer 115 and a second planarization layer 116. The planarization layers 115 and 116 may each be made of any one of acrylic resin, epoxy resin, phenolic resin, polyamide-based resin, polyimide-based resin, unsaturated polyester-based resin, polyphenylene-based resin, polyphenylene sulfide-based resin, benzocyclobutene, and photoresist. However, the present disclosure is not limited thereto.

The first planarization layer 115 is disposed on the hydrogen blocking layer 114. The first planarization layer 115 is an insulating layer that serves to protect the transistor 130 and flatten an upper portion of the transistor 130. The first planarization layer 115 has a contact hole through which the drain electrode 134 of the transistor 130 is exposed. FIG. 2 illustrates that the contact hole is formed in the first planarization layer 115 in order to expose the drain electrode 134. However, the present disclosure is not limited thereto. For example, the first planarization layer 115 may have a contact hole through which the source electrode 133 is exposed.

The connection electrode 141 is disposed on the first planarization layer 115. The connection electrode 141 may serve to electrically connect the transistor 130 and the light-emitting element 150. The connection electrode 141 is electrically connected to the drain electrode 134 of the transistor 130 through the contact hole formed in the first planarization layer 115 and the hydrogen blocking layer 114. The connection electrode 141 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof.

The second planarization layer 116 is disposed on the first planarization layer 115. The second planarization layer 116 is an insulating layer that serves to flatten an upper portion of the first planarization layer 115 and an upper portion of the connection electrode 141. The second planarization layer 116 has a contact hole through which the connection electrode 141 is exposed.

The light-emitting element 150 is disposed over the second planarization layer 116. The light-emitting element 150 includes the first electrode 151 electrically connected to the drain electrode 134 of the transistor 130, the light-emitting layer 152 disposed on the first electrode 151, and the second electrode 153 formed on the light-emitting layer 152.

The first electrode 151 is disposed on the second planarization layer 116. The first electrode 151 is disposed to correspond to each of the plurality of subpixels SP. The first electrode 151 may be an anode of the light-emitting element 150. The first electrode 151 may be electrically connected to the drain electrode 134 of the transistor 130 through the connection electrode 141. However, the first electrode 151 may be electrically connected to the source electrode 133 of the transistor 130 depending on the type of transistor 130, a method of designing the drive circuit, and the like.

In this case, because the first electrode 151 supplies positive holes to the light-emitting layer 152, the first electrode 151 may be made of an electrically conductive material having a high work function. The first electrode 151 may have a multilayered structure including a transparent conductive film and an opaque conductive film having high reflection efficiency. The transparent conductive film may be made of a material such as indium tin oxide (ITO) and indium zinc oxide (IZO) having a comparatively large work function value. The opaque conductive film may have a single-layered or multilayered structure made of Al, Ag, Cu, Pb, Mo, Ti, or an alloy thereof. However, the material of the first electrode 151 is not limited thereto.

The bank 160 is disposed on the second planarization layer 116 and the first electrode 151. The bank 160 may be formed on the second planarization layer 116 and cover an edge of the first electrode 151. The bank 160 is an insulating layer disposed between the plurality of subpixels in order to divide the plurality of subpixels SP. The bank 160 may be made of an organic insulating material. For example, the bank 160 may be made of, but not limited to, polyimide-based resin, acryl-based resin, or benzocyclobutene (BCB)-based resin.

The light-emitting layer 152 is disposed on the first electrode 151 and the bank 160. The light-emitting layer 152 may be formed over the entire surface of the substrate 110. That is, the light-emitting layer 152 may be a common layer formed in common over the plurality of subpixels SP. The light-emitting layer 152 may be an organic layer that emits light with a particular color. For example, the light-emitting layer 152 may be one of a red light-emitting layer, a green light-emitting layer, a blue light-emitting layer, and a white light-emitting layer. When the light-emitting layer 152 is configured as a white light-emitting layer, a color filter may further be disposed over the light-emitting element 150. The light-emitting layer 152 may further include various layers such as a hole transport layer, a hole injection layer, a hole blocking layer, an electron injection layer, an electron blocking layer, and an electron transport layer.

The second electrode 153 is disposed on the light-emitting layer 152. The second electrode 153 may be a single layer formed over the entire surface of the substrate 110. That is, the second electrode 153 may be a common layer formed in common over the plurality of subpixels SP. Since the second electrode 153 supplies the electrons to the light-emitting layer 152, the second electrode 153 may be made of an electrically conductive material with a low work function. For example, the second electrode 153 may be made of a transparent electrically conductive material such as indium tin oxide (ITO) and indium zinc oxide (IZO) or made of a metal alloy such as MgAg or an ytterbium (Yb) alloy. The second electrode 153 may further include a metal doping layer. However, the present disclosure is not limited thereto.

The encapsulation unit 170 is disposed over the light-emitting element 150. For example, the encapsulation unit 170 is disposed on the second electrode 153 and covers the light-emitting element 150. The encapsulation unit 170 protects the light-emitting element 150 from moisture and oxygen that penetrate into the display device 100 from the outside. The encapsulation unit 170 may have a structure in which inorganic layers and organic layers are alternately stacked. The encapsulation unit 170 includes a first encapsulation layer 171, a particle covering layer 172, and a second encapsulation layer 173.

The first encapsulation layer 171 may be disposed on the second electrode 153 and inhibit penetration of moisture or oxygen. The first encapsulation layer 171 may be made of an inorganic material such as silicon nitride (SiNx), silicon oxynitride (SiNxOy), silicon oxide (SiOx), and aluminum oxide (AlyOz). However, the present disclosure is not limited thereto.

The particle covering layer 172 is disposed on the first encapsulation layer 171 and flattens an upper surface of the first encapsulation layer 171. In addition, the particle covering layer 172 may cover foreign substances or particles that may be produced during the manufacturing process. The particle covering layer 172 may be made of an organic material, for example, silicon oxycarbon (SiOxCz) or acrylic or epoxy-based resin. However, the present disclosure is not limited thereto.

The second encapsulation layer 173 may be disposed on the particle covering layer 172 and inhibit penetration of moisture or oxygen, like the first encapsulation layer 171. The second encapsulation layer 173 may be made of an inorganic material such as silicon nitride (SiNx), silicon oxynitride (SiNxOy), silicon oxide (SiOx), and aluminum oxide (AlyOz). However, the present disclosure is not limited thereto. The second encapsulation layer 173 may be made of the same material as the first encapsulation layer 171. Alternatively, the second encapsulation layer 173 may be made of a material different from a material of the first encapsulation layer 171.

In the case in which the inorganic layer is included in the encapsulation unit, a large amount of hydrogen ($H_2$) is produced during the manufacturing process. Therefore, the inorganic layer of the encapsulation unit contains a large amount of hydrogen. The hydrogen in the inorganic layer of the encapsulation unit may be diffused to another area of the display device over time. When the hydrogen in the inorganic layer of the encapsulation unit penetrates into the transistor including the active layer made of an oxide semiconductor, characteristics of the transistor are changed. Specifically, the threshold voltage (Vth) of the transistor is shifted in a negative direction, which may cause degradation of the transistor. In particular, the oxide semiconductor has properties more vulnerable to hydrogen. Therefore, there is a problem in that the display device including the oxide semiconductor thin-film transistor is more vulnerable to degradation and defects of the transistor caused by hydrogen, and quality and reliability deteriorate.

Therefore, the display device 100 according to the aspect of the present disclosure includes the hydrogen blocking layer 114 disposed between the transistor 130 and the planarization layers 115 and 116, thereby minimizing the diffusion of hydrogen to the transistor 130. In particular, the hydrogen blocking layer 114 may be doped with the hydrogen capture material having hydrogen capturing properties. Therefore, the diffusion of hydrogen, which is diffused from the first encapsulation layer 171 and the second encapsulation layer 173 of the encapsulation unit 170, may be blocked by the hydrogen capture material of the hydrogen blocking layer 114. Therefore, the penetration of hydrogen into the transistor 130 may be minimized, the degradation of the element may be suppressed, and the reliability of the display device 100 may be improved.

According to the display device 100 according to the aspect of the present disclosure, the connection electrode 141 may serve as an auxiliary hydrogen blocking layer. That is, the connection electrode 141 may also include a hydrogen capture material. Specifically, the connection electrode 141 may be made of titanium (Ti) that is a hydrogen capture material. In this case, titanium has properties capable of capturing hydrogen when titanium meets hydrogen. In addition, a thickness of the connection electrode 141 may be 300 Å to 7,000 Å. The connection electrode 141 may overlap with the transistor 130 and block the movement of the hydrogen from the encapsulation unit 170 toward the transistor 130. As a result, the connection electrode 141 and the hydrogen blocking layer 114 may doubly inhibit hydrogen from being diffused toward the transistor 130. Therefore, the quality of the display device 100 may be further improved.

According to the display device 100 according to the aspect of the present disclosure, the hydrogen blocking layer 114 may be formed over the entire surface of the substrate 110. Therefore, even if hydrogen is diffused through the region in which the connection electrode 141 is not disposed, the hydrogen blocking layer 114 may inhibit hydrogen from being diffused to the lower side of the hydrogen blocking layer 114. Therefore, it is possible to improve a degree of design freedom of the connection electrode 141 that is an auxiliary hydrogen blocking layer.

According to the display device 100 according to the aspect of the present disclosure, the hydrogen blocking layer 114 may be formed by doping an insulating material layer with a hydrogen capture material. That is, a passivation layer, which is one of the insulating layers included in the display device 100, may be configured as the hydrogen blocking layer 114. Therefore, even if the display device 100 includes the hydrogen blocking layer 114, the design of electrodes or lines is not affected. Therefore, it is possible to suppress the degradation of the transistor 130 while maintaining the properties of the display device 100 without change.

FIGS. 3A to 3D are cross-sectional views of display devices according to various aspects of the present disclosure. Display devices 300A, 300B, 300C, and 300D illustrated in FIGS. 3A to 3D are substantially identical to the display device 100 illustrated in FIGS. 1 and 2, except for a passivation layer 314 and hydrogen blocking layers 313, 312, 315, and 316. Therefore, repeated descriptions of the identical components will be omitted.

Referring to FIGS. 3A to 3D, a passivation layer 314 is disposed between the transistor 130 and the first planarization layer 115. The passivation layer 314 may be an insulating layer for protecting the transistor 130. However, the passivation layer 314 may be eliminated in accordance with design. The passivation layer 314 may be configured as a single layer made of silicon nitride (SiNx) or silicon oxide (SiOx) that is an inorganic material. Alternatively, the passivation layer 314 may be configured as a multilayer made of silicon nitride (SiNx) or silicon oxide (SiOx). However, the present disclosure is not limited thereto.

Figure 3A:
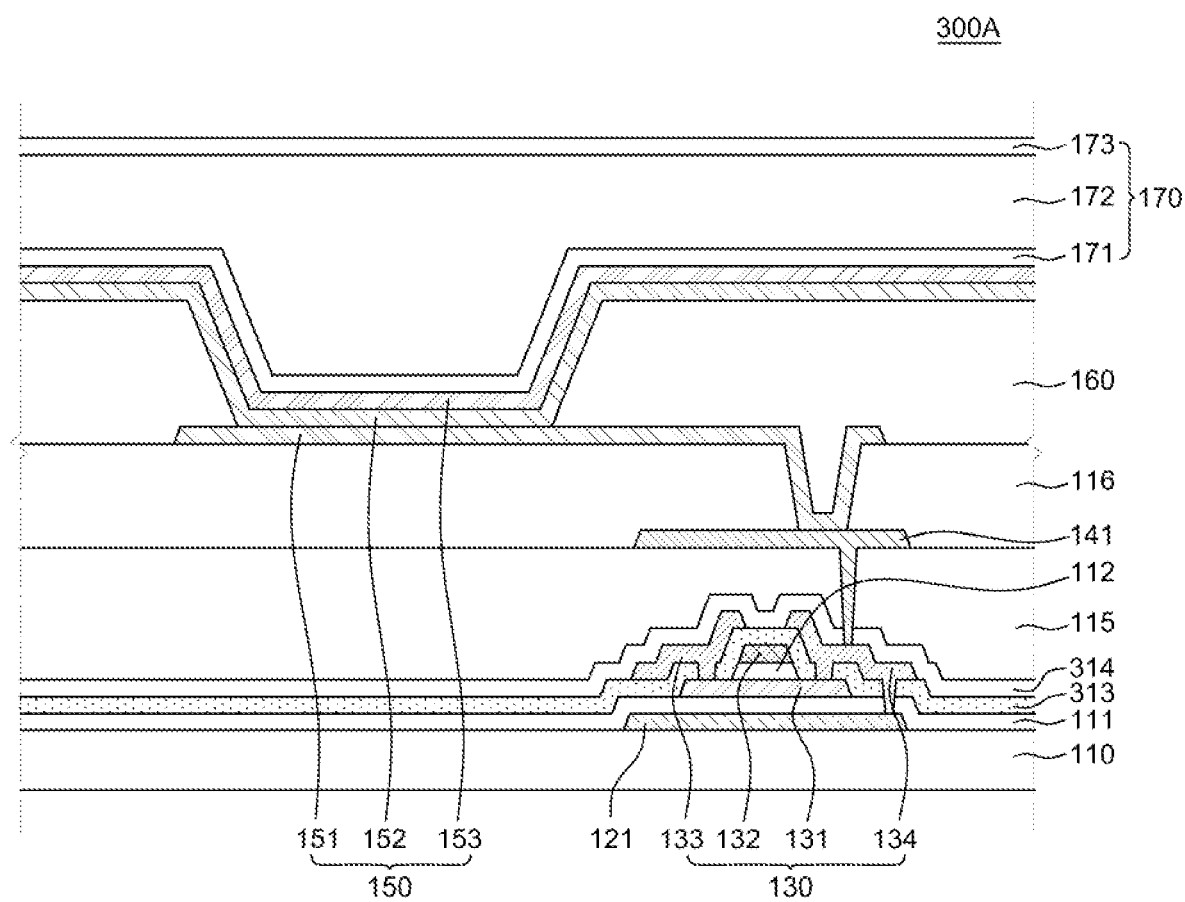
FIGS. 3A to 3D are cross-sectional views of display devices according to various aspects of the present disclosure.

Referring to FIG. 3A, the hydrogen blocking layer 313 of the display device 300A according to another aspect of the present disclosure may be an interlayer insulating layer. Specifically, the hydrogen blocking layer 313 is disposed to overlay the buffer layer 111, the active layer 131, the gate insulating layer 112, and the gate electrode 132. In addition, the source electrode 133 and the drain electrode 134 may be disposed on the hydrogen blocking layer 313. The hydrogen blocking layer 313 may completely overlay the active layer 131 and be formed over the entire surface of the substrate 110. Therefore, the hydrogen blocking layer 313 may inhibit the degradation of the active layer 131 caused by the diffusion of hydrogen. The hydrogen blocking layer 313 may be made of the same material as the hydrogen blocking layer 114 illustrated in FIGS. 1 and 2.

Figure 3B:
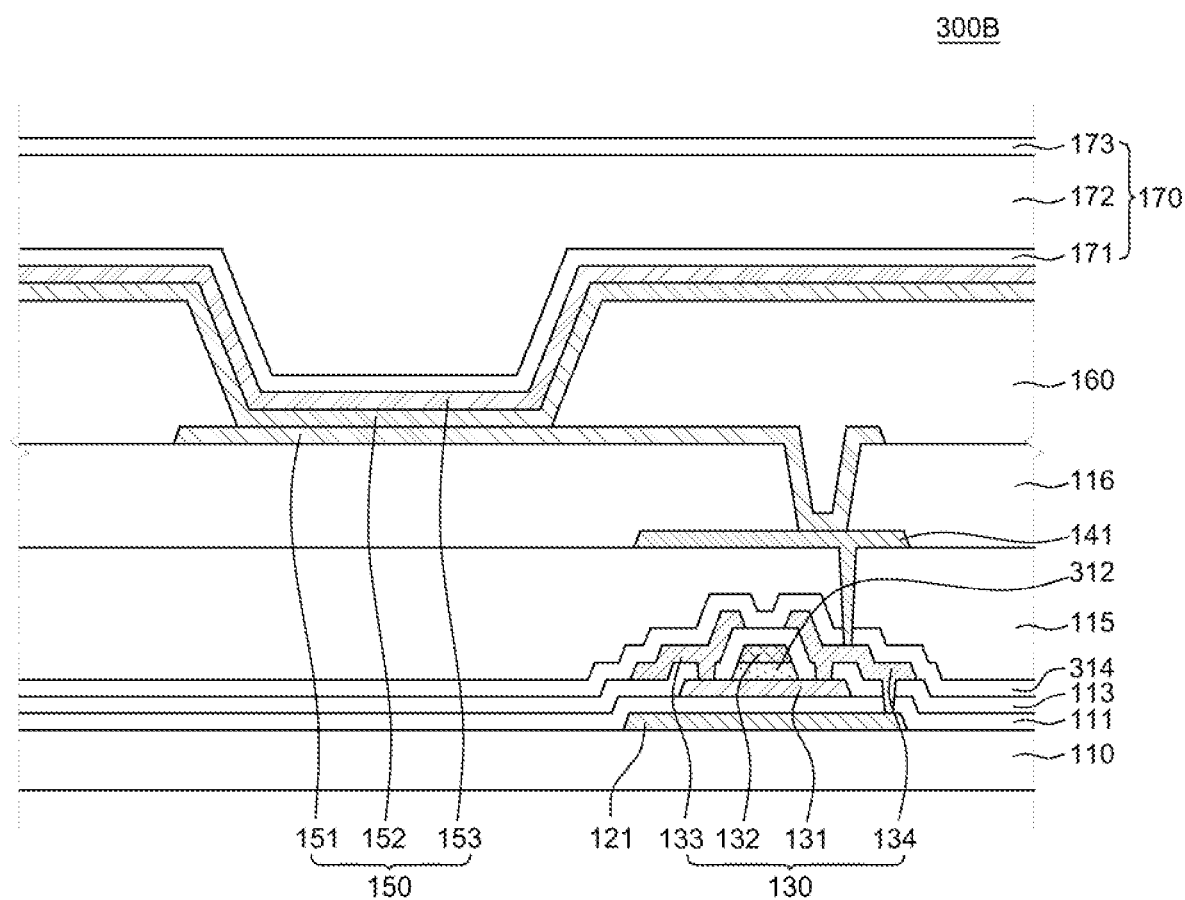

Referring to FIG. 3B, the hydrogen blocking layer 312 of the display device 300B according to still another aspect of the present disclosure may be a gate insulating layer. Specifically, the hydrogen blocking layer 312 may be disposed to cover the channel area of the active layer 131 while overlapping with the gate electrode 132. Therefore, the hydrogen blocking layer 312 may inhibit the degradation of the active layer 131 caused by the diffusion of hydrogen. The hydrogen blocking layer 312 may be made of the same material as the hydrogen blocking layer 114 illustrated in FIGS. 1 and 2.

Figure 3C:
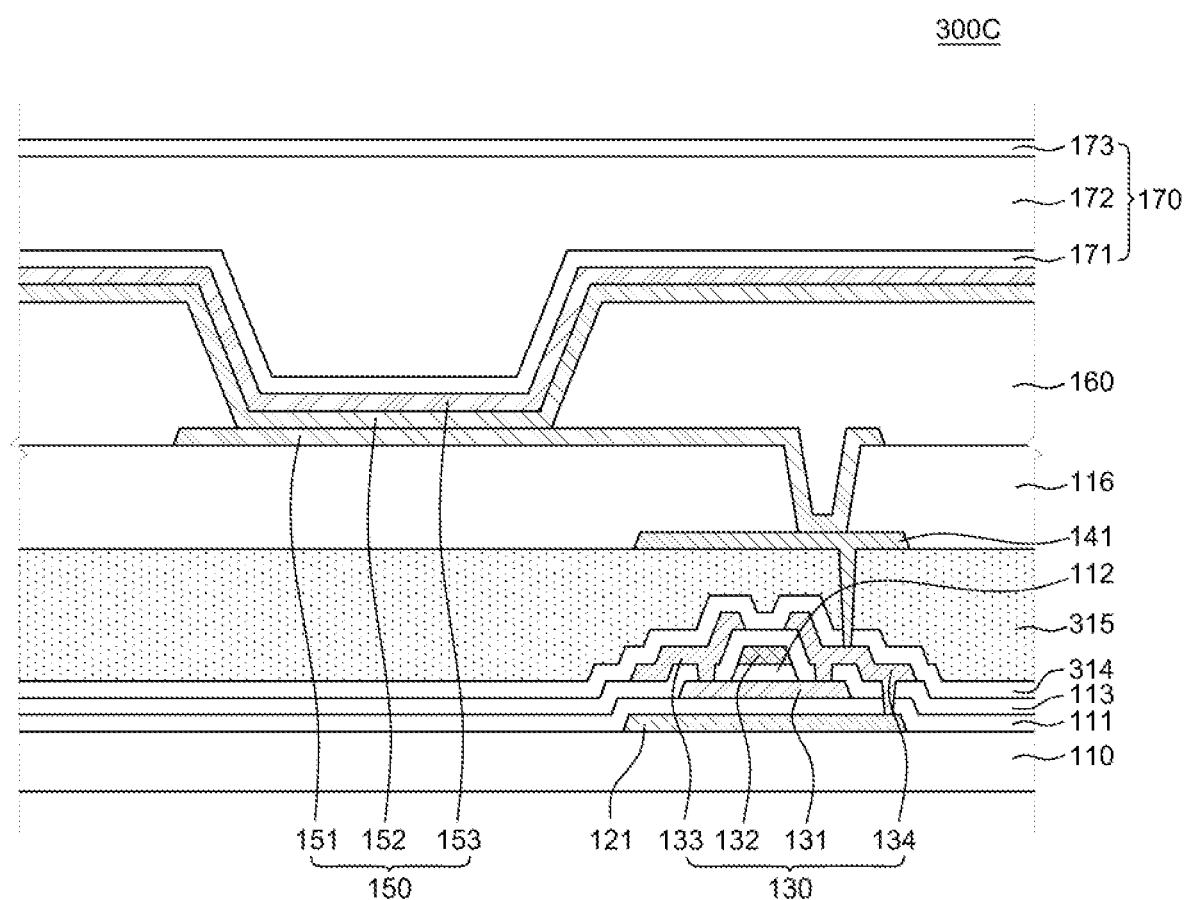

Referring to FIG. 3C, the hydrogen blocking layer 315 of the display device 300C according to yet another aspect of the present disclosure may be a first planarization layer. Specifically, the hydrogen blocking layer 315 is disposed to cover the passivation layer 314. The hydrogen blocking layer 315 may be formed over the entire surface of the substrate 110. Therefore, the hydrogen blocking layer 315 may inhibit the degradation of the active layer 131 caused by the diffusion of hydrogen. The hydrogen blocking layer 315 may be made of the same material as the hydrogen blocking layer 114 illustrated in FIGS. 1 and 2.

Figure 3D:
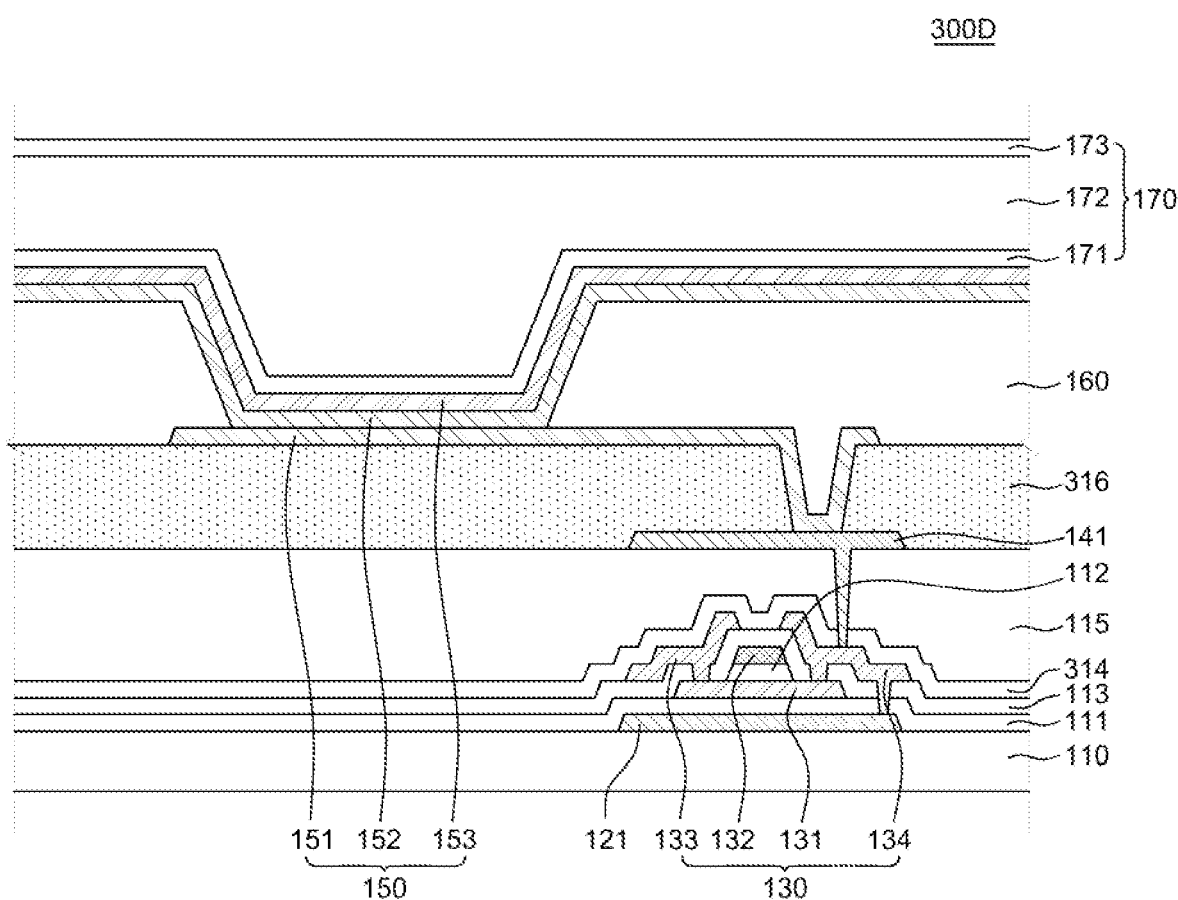

Referring to FIG. 3D, the hydrogen blocking layer 316 of the display device 300D according to still yet another aspect of the present disclosure may be a second planarization layer 115. Specifically, the hydrogen blocking layer 316 is disposed to cover the first planarization layer. The hydrogen blocking layer 316 may be formed over the entire surface of the substrate 110. Therefore, the hydrogen blocking layer 316 may inhibit the degradation of the active layer 131 caused by the diffusion of hydrogen. The hydrogen blocking layer 316 may be made of the same material as the hydrogen blocking layer 114 illustrated in FIGS. 1 and 2.

As illustrated in FIGS. 3A to 3D, the hydrogen blocking layers 313, 312, 315, and 316 may each be configured as one of the various insulating layers of the display devices 300A, 300B, 300C, and 300D. In particular, the hydrogen blocking layers 313, 312, 315, and 316 may each be configured as one of the insulating layers disposed between the light-emitting element 150 and the active layer 131 of the transistor 130. Therefore, it is possible to minimize the penetration of hydrogen, which is diffused from the first encapsulation layer 171 and the second encapsulation layer 173 of the encapsulation unit 170, into the transistor 130.

Meanwhile, FIGS. 1 to 3D illustrate that only the single insulating layer is configured as the hydrogen blocking layer 114, 313, 312, 315, or 316. However, the present disclosure is not limited thereto. For example, in some instances, the display device may complexly include the plurality of hydrogen blocking layers 114, 313, 312, 315, and 316.

[Table 1] shows the comparison in changes in threshold voltages (Vth) of the transistors between examples and comparative examples. Comparative Examples 1 and 2 are general display devices that are not subjected to the doping with the hydrogen capture material. Example 1 is a hydrogen blocking layer made by doping a passivation layer made of silicon dioxide ($SiO_2$) with boron (B) as a hydrogen capture material. Example 2 is a hydrogen blocking layer made by doping an interlayer insulating layer made of silicon dioxide ($SiO_2$) with boron (B) as a hydrogen capture material. That is, the structures according to Examples 1 and 2 may respectively correspond to the structures illustrated in FIGS. 2 and 3A. In this case, a doping condition of boron (B) was set to 2×10^15, 40 k, 200 uA. In addition, the voltage of the conductor was calculated as −20 V. In addition, the examples and the comparative example used a low-temperature silicon nitride (SiNx) layer as a layer for diffusing hydrogen.

TABLE 1

|  | Low-temperature silicon nitride | Threshold voltage (V) | Difference in threshold voltage |
|---|---|---|---|
| Comparative Example 1 | X | 0.50 | −10.26 |
|  | ○ | −9.76 |  |
| Comparative Example 2 | X | 0.55 | −10.41 |
|  | ○ | −9.86 |  |
| Example 1 | X | 0.55 | −0.78 |
|  | ○ | −0.23 |  |
| Example 2 | X | 0.67 | −4.46 |
|  | ○ | −3.79 |  |

Referring to [Table 1], it can be seen that the threshold voltage varies depending on whether the low-temperature silicon nitride (SiNx) layer, which is a layer for diffusing hydrogen, is present. Specifically, when the low-temperature silicon nitride layer is present, the transistor is degraded by the diffusion of hydrogen, such that the threshold voltage is shifted in a negative direction. In the case of Comparative Examples 1 and 2, a difference in threshold voltage between the presence and absence of the low-temperature silicon nitride layer is −10 V or more. Therefore, it can be seen that a degree of degradation of the transistor is high. In contrast, in the case of Examples 1 and 2 including the hydrogen blocking layer, it can be seen that a degree of shift of threshold voltage is remarkably reduced in comparison with Comparative Examples 1 and 2. That is, the hydrogen blocking layer may suppress the diffusion of hydrogen, thereby inhibiting the degradation of the transistor.

Figure 4A:
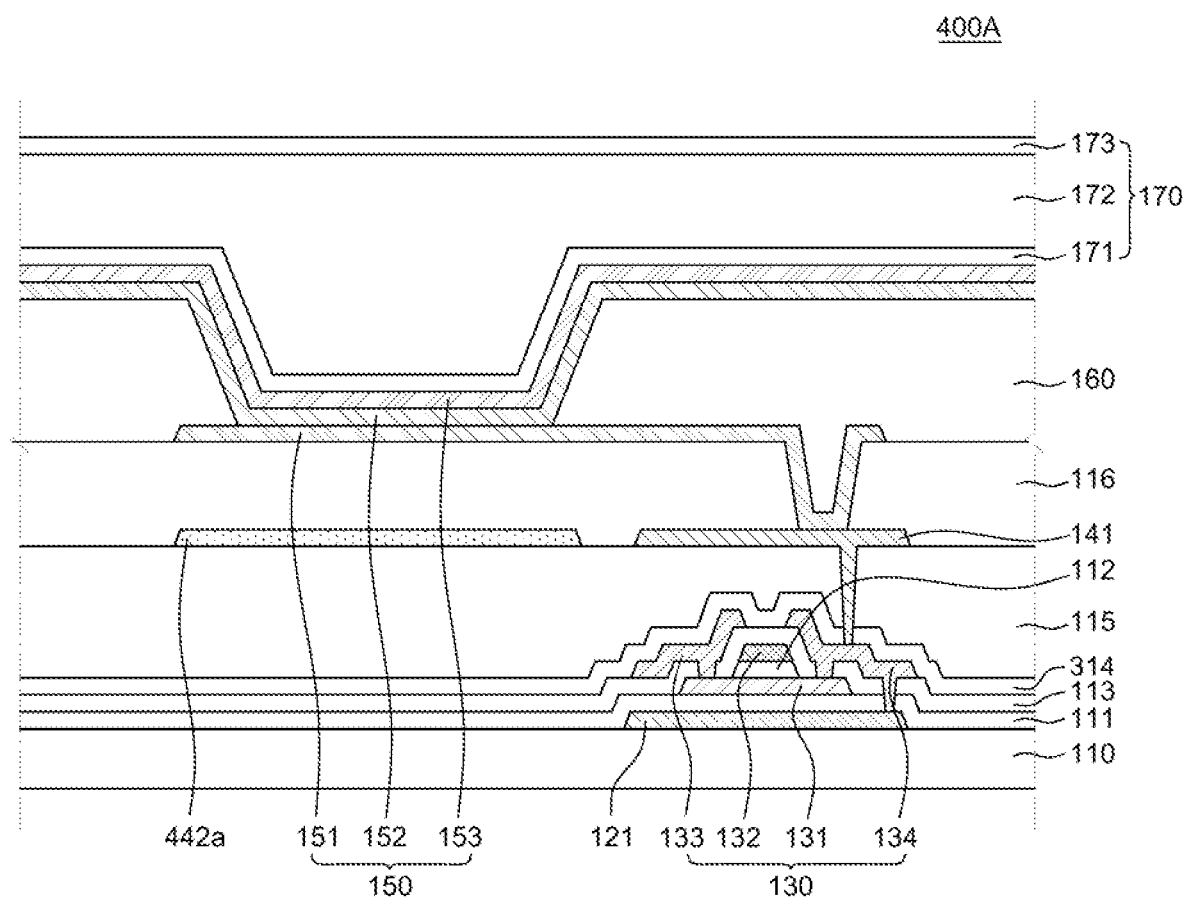
FIGS. 4A and 4B are cross-sectional views of display devices according to various aspects of the present disclosure.
Figure 4B:
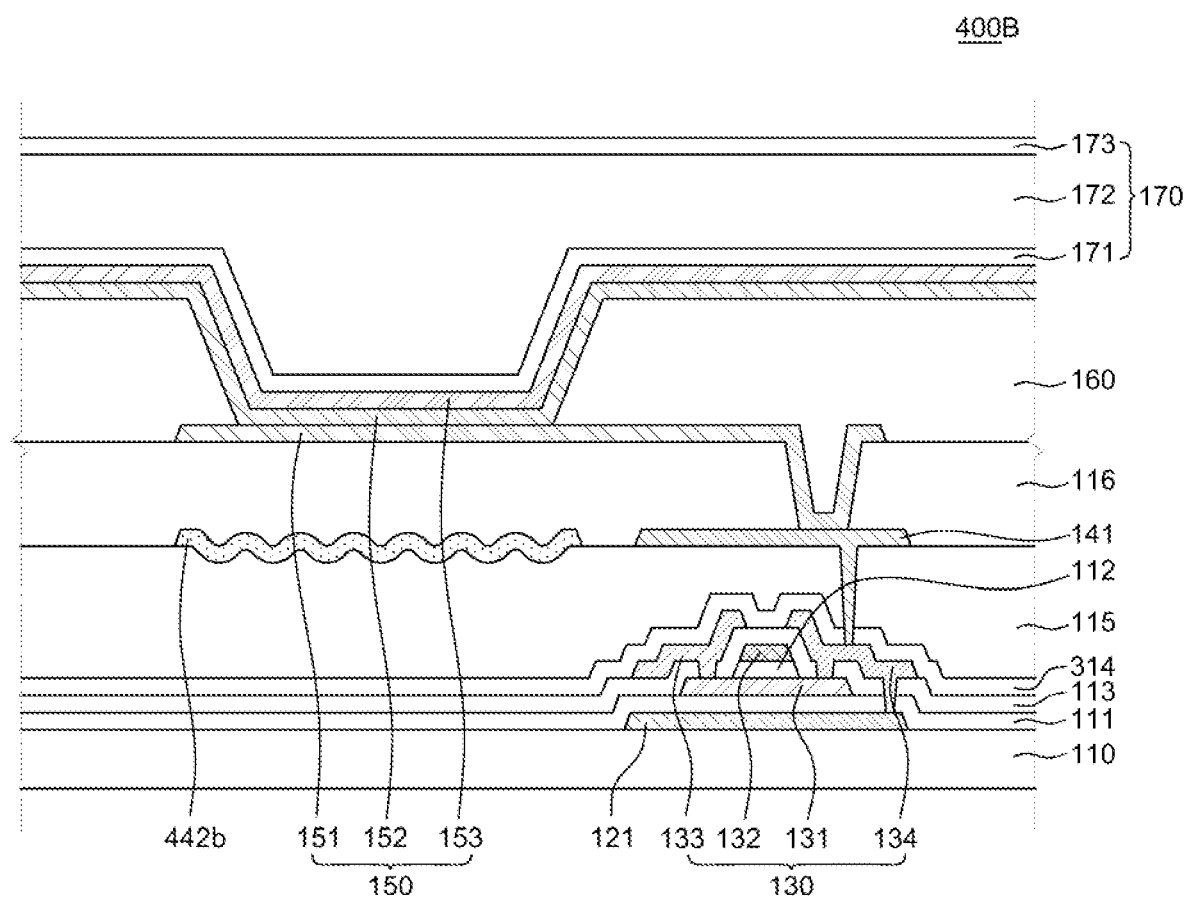

FIGS. 4A and 4B are cross-sectional views of display devices according to various aspects of the present disclosure. Display devices 400A and 400B illustrated in FIGS. 4A and 4B are substantially identical to the display devices 100, 300A, 300B, 300C, and 300D illustrated in FIGS. 1 to 3D, except for hydrogen blocking layers 442a and 442b. Therefore, repeated descriptions of the identical components will be omitted.

Referring to FIGS. 4A and 4B, the display devices 400A and 400B according to another aspect of the present disclosure respectively include hydrogen blocking layers 442a and 442b disposed between the first planarization layer 115 and the second planarization layer 116. The hydrogen blocking layers 442a and 442b are disposed on the same layer as the connection electrode 141. In addition, the hydrogen blocking layers 442a and 442b may be disposed in a region in which the hydrogen blocking layers 442a and 442b overlap with the light-emitting element 150. The hydrogen blocking layers 442a and 442b may be made of the same material as the hydrogen blocking layer 114 illustrated in FIGS. 1 and 2.

As illustrated in FIG. 4A, the hydrogen blocking layer 442a may have a flat surface. Alternatively, as illustrated in FIG. 4B, the hydrogen blocking layer 442b may include a concave-convex pattern. FIG. 4B illustrates that the hydrogen blocking layer 442b has a wavy shape, but the present disclosure is not limited thereto. For example, a cross-section of the hydrogen blocking layer 442b may have various concave-convex patterns such as a circular shape, an elliptical shape, or a polygonal shape. Alternatively, the hydrogen blocking layer 442b may have various structures such as a mesh pattern or a honeycomb pattern.

Meanwhile, a process of forming the concave-convex pattern of the hydrogen blocking layer 442b may be performed as follows. First, a concave-convex pattern is formed on the first planarization layer 115. In this case, the concave-convex pattern of the first planarization layer 115 may be formed by exposing an upper surface of the first planarization layer 115 by using a halftone mask or etching the upper surface of the first planarization layer 115 by using a photoresist. Next, the hydrogen blocking layer 442b is formed on the first planarization layer 115. In this case, the hydrogen blocking layer 442b may be formed by depositing a deposition gas containing a hydrogen capture material and a material of an insulating material layer by using chemical vapor deposition (CVD). Alternatively, the hydrogen blocking layer may be formed by forming only the insulating material layer on the first planarization layer 115 first, and then doping the insulating material layer with the hydrogen capture material. However, the process of forming the hydrogen blocking layer is not limited to the above-mentioned contents.

In the display devices 400A and 400B according to the aspect of the present disclosure, the separate hydrogen blocking layer 442a or 442b may be disposed between the first planarization layer 115 and the second planarization layer 116, thereby inhibiting hydrogen from being diffused toward the transistor 130. In particular, even if hydrogen, which is not blocked by the connection electrode 141, is diffused in the horizontal direction along the second planarization layer 116, the hydrogen blocking layers 442a and 442b may minimize the amount of hydrogen diffused from the second planarization layer 116 to the first planarization layer 115. Therefore, it is possible to more effectively inhibit degradation of the transistor 130.

The hydrogen blocking layers 442a and 442b may be formed by doping an insulating material layer with a hydrogen capture material. Therefore, even if the display devices 400A and 400B respectively have the separate hydrogen blocking layers 442a and 442b, the design of electrodes or lines is not affected. Therefore, it is possible to suppress the degradation of the transistor 130 while maintaining the properties of the display devices 400A and 400B without change.

The hydrogen blocking layer 442b of the display device 400B according to yet another aspect of the present disclosure may include the concave-convex pattern. Therefore, it is possible to increase an area in which the hydrogen blocking layer 442b may capture hydrogen. Therefore, the effect of the hydrogen blocking layer 442b for blocking hydrogen may be further improved.

Figure 5A:
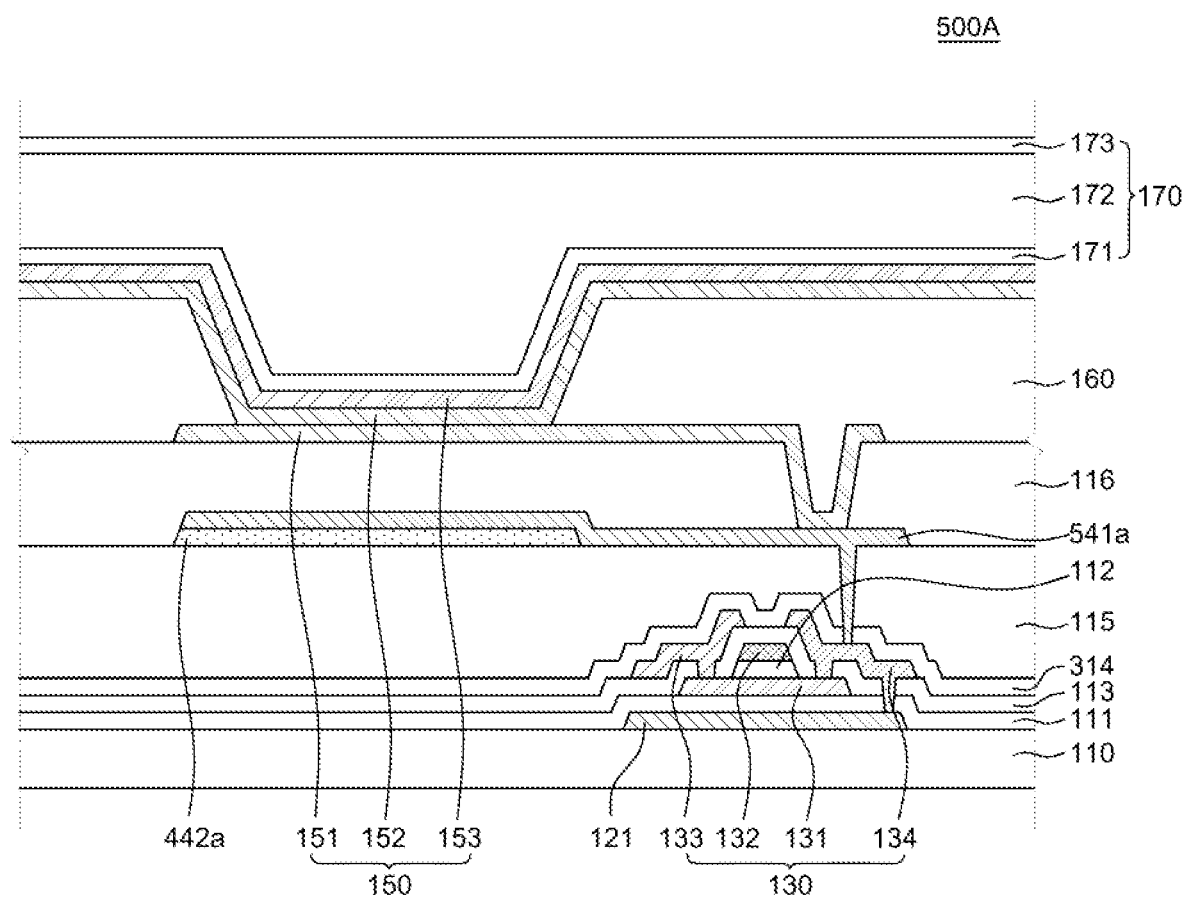
FIGS. 5A and 5B are cross-sectional views of display devices according to various aspects of the present disclosure.
Figure 5B:
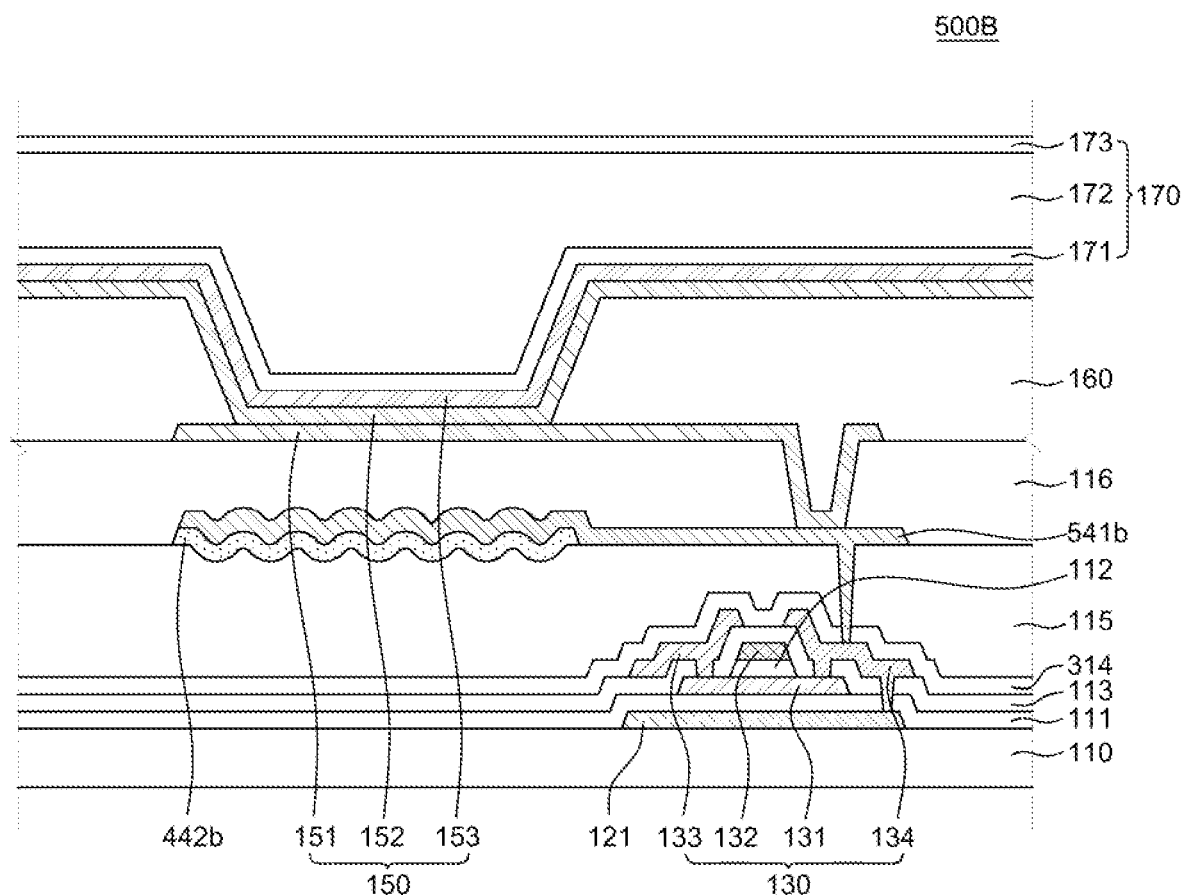

FIGS. 5A and 5B are cross-sectional views of display devices according to various aspects of the present disclosure. Display devices 500A and 500B illustrated in FIGS. 5A and 5B are substantially identical to the display devices 400A and 400B illustrated in FIGS. 4A and 4B, except for connection electrodes 541a and 541b. Therefore, repeated descriptions of the identical components will be omitted.

Referring to FIGS. 5A and 5B, the connection electrodes 541a and 541b of the display devices 500A and 500B according to another aspect of the present disclosure are disposed to cover the hydrogen blocking layers 442a and 442b, respectively. Specifically, the connection electrode 541a or 541b may extend from a region in which the connection electrode 541*a* or 541*b* overlaps with the transistor 130 to a region in which the connection electrode 541*a* or 541*b* overlaps with the light-emitting element 150.

According to the display device 500A and 500B according to the aspect of the present disclosure, the connection electrode 541*a* or 541*b*, which serves as an auxiliary hydrogen blocking layer, may extend to a region in which the connection electrode 541*a* or 541*b* overlaps with the hydrogen blocking layer 442*a* or 442*b*. Therefore, even if hydrogen is diffused in the horizontal direction along the second planarization layer 116, the connection electrode 541*a* or 541*b* may minimize the diffusion of hydrogen from the second planarization layer 116 to the first planarization layer 115.

The connection electrode 541*a* or 541*b* may be disposed to overlap with the hydrogen blocking layer 442*a* or 442*b* while directly adjoining the hydrogen blocking layer 442*a* or 442*b*. Therefore, the connection electrode 541*a* or 541*b* and the hydrogen blocking layer 442*a* or 442*b* may doubly block hydrogen, thereby more effectively suppressing degradation of the transistor 130.

According to the display device 500A and 500B according to the aspect of the present disclosure, overall resistance may be reduced by the connection electrode 541*a* and 541*b*. Specifically, the connection electrode 541*a* or 541*b* electrically connects the transistor 130 and the light-emitting element 150. In this case, since the connection electrode 541*a* or 541*b* overlaps with both the transistor 130 and the light-emitting element 150, an area of the connection electrode 541*a* or 541*b* may increase. Therefore, the resistance of the display device 500A and 500B may be reduced, thereby improving electric power consumption.

The connection electrode 541*b* of the display device 500B according to the aspect of the present disclosure may include a concave-convex pattern consistent with the concave-convex pattern of the hydrogen blocking layer 442*b*. Therefore, an area of the connection electrode 541*b* may further increase, thereby further improving the effect of blocking hydrogen. In addition, an area of the connection electrode 541*b* may further increase, thereby further reducing the overall resistance of the display device 500B.

Meanwhile, FIG. 5B illustrates that the connection electrode 541*b* is disposed on an upper portion of the hydrogen blocking layer 442*b*. However, a low-potential power line VSS may be disposed on the upper portion of the hydrogen blocking layer 442*b*, instead of the connection electrode 541*b*. In this case, the resistance of the low-potential power line VSS may be reduced, thereby coping with low-potential voltage rising (VSS rising). Therefore, the drive voltage and electric power consumption may be reduced, and the brightness deviation of the display device 500B may be improved. Alternatively, an area of the low-potential power line VSS may be reduced as the resistance of the low-potential power line VSS is kept constant. Therefore, it is possible to improve a degree of design freedom of electrodes or lines disposed on the same layer as the low-potential power line VSS.

Figure 6A:
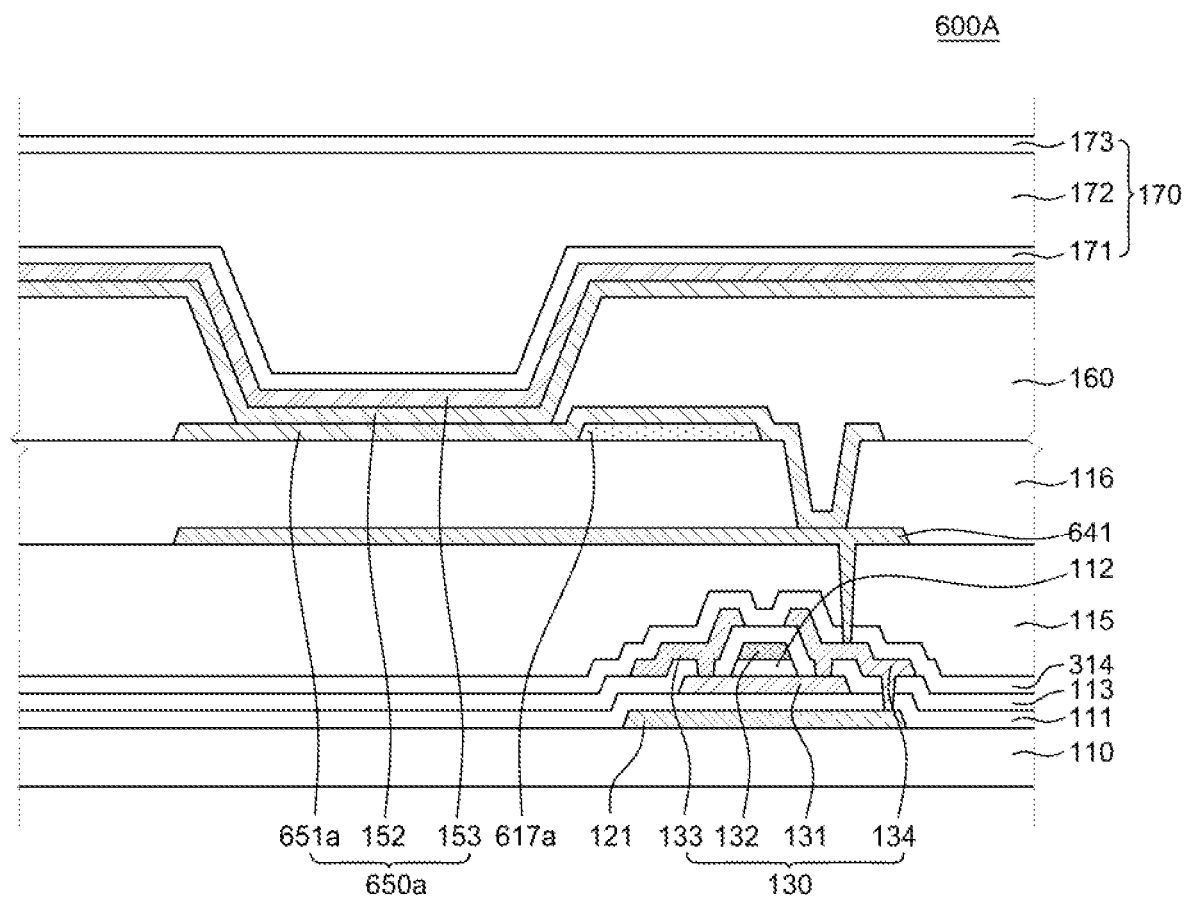
FIGS. 6A and 6B are cross-sectional views of display devices according to various aspects of the present disclosure.
Figure 6B:
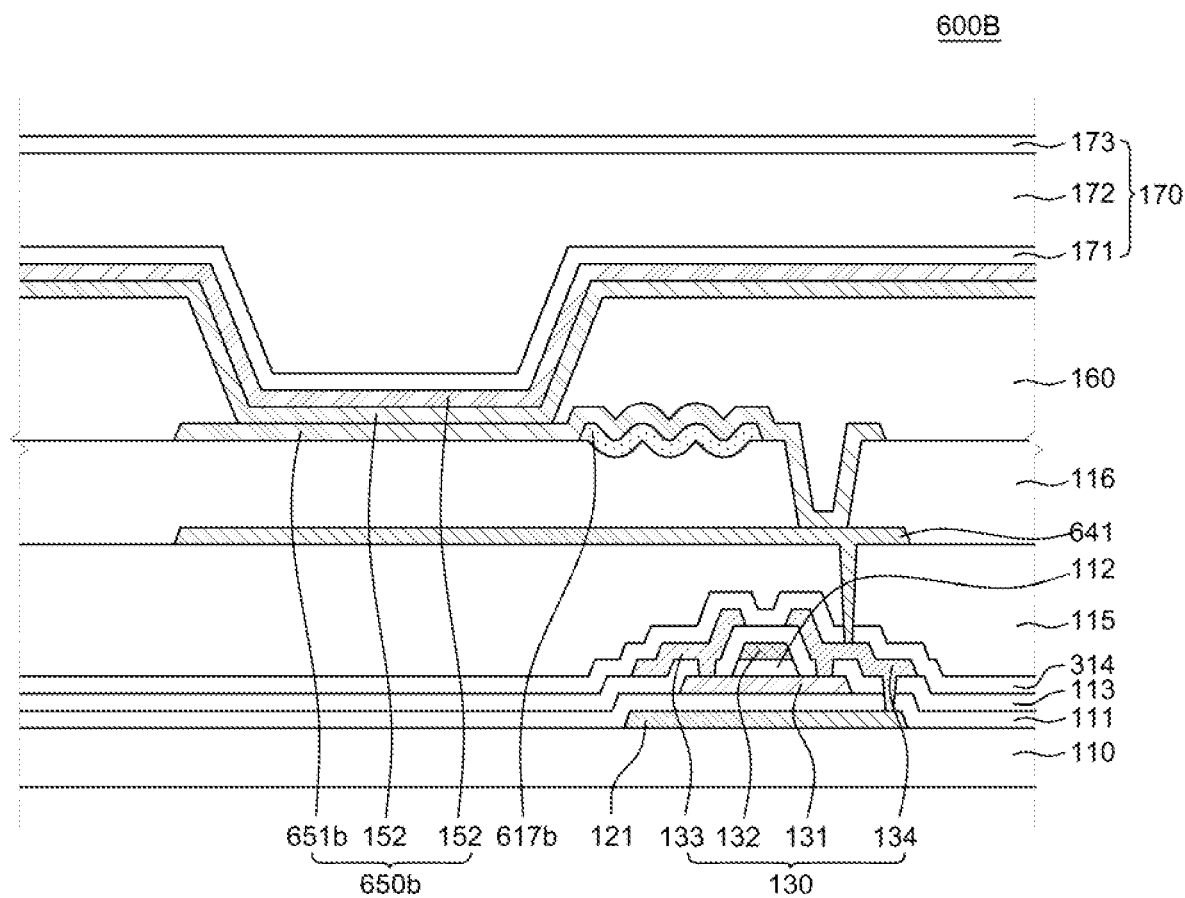

FIGS. 6A and 6B are cross-sectional views of display devices according to various aspects of the present disclosure. Display devices 600A and 600B illustrated in FIGS. 6A and 6B are substantially identical to the display devices 100, 300A, 300B, 300C, and 300D illustrated in FIGS. 1 to 3D, except for a connection electrode 641, hydrogen blocking layers 617*a* and 617*b*, and light-emitting elements 650*a* and 650*b*. Therefore, repeated descriptions of the identical components will be omitted.

Referring to FIGS. 6A and 6B, the connection electrode 641 may extend from a region in which the connection electrode 641 overlaps with the transistor 130 to a region in which the connection electrode 641 overlaps with the light-emitting element 650*a* or 650*b*. The hydrogen blocking layer 617*a* or 617*b* may be disposed between the first electrode 651*a* or 651*b* of the light-emitting element 650*a* or 650*b* and the second planarization layer 116. In this case, the hydrogen blocking layer 617*a* or 617*b* may be disposed only in a region in which the hydrogen blocking layer 617*a* or 617*b* overlaps with the bank 160. The hydrogen blocking layers 617*a* and 617*b* may be made of the same material as the hydrogen blocking layer 114 illustrated in FIGS. 1 and 2.

According to the display device 600A and 600B according to the aspect of the present disclosure, the separate hydrogen blocking layer 617*a* or 617*b* may be disposed between the first electrode 651*a* or 651*b* and the second planarization layer 116, thereby suppressing the diffusion of hydrogen to the transistor 130. In particular, because the hydrogen blocking layer 617*a* or 617*b* may be disposed close to the encapsulation unit 170, thereby further improving the effect of blocking hydrogen.

According to the display device 600A and 600B according to the aspect of the present disclosure, the connection electrode 641, which serves as an auxiliary hydrogen blocking layer, may extend from a region in which the connection electrode 641 overlaps with the transistor 130 to a region in which the connection electrode 641 overlaps with the light-emitting element 650*a* or 650*b*. Therefore, it is possible to suppress the diffusion of hydrogen that is diffused in the horizontal direction. In addition, an area of the connection electrode 641 may increase, and the resistance of the display devices 600A and 600B may be reduced, thereby improving electric power consumption.

The hydrogen blocking layer 617*b* of the display device 600B according to yet another aspect of the present disclosure may include a concave-convex pattern. Therefore, an area of the hydrogen blocking layer 617*b* may increase, thereby further improving the effect of blocking hydrogen.

In addition, the first electrode 651*b* disposed on an upper portion of the hydrogen blocking layer 617*b* may also include a concave-convex pattern. Therefore, an area of the first electrode 651*b* may increase, thereby further reducing the overall resistance of the display device 600B.

Figure 7A:
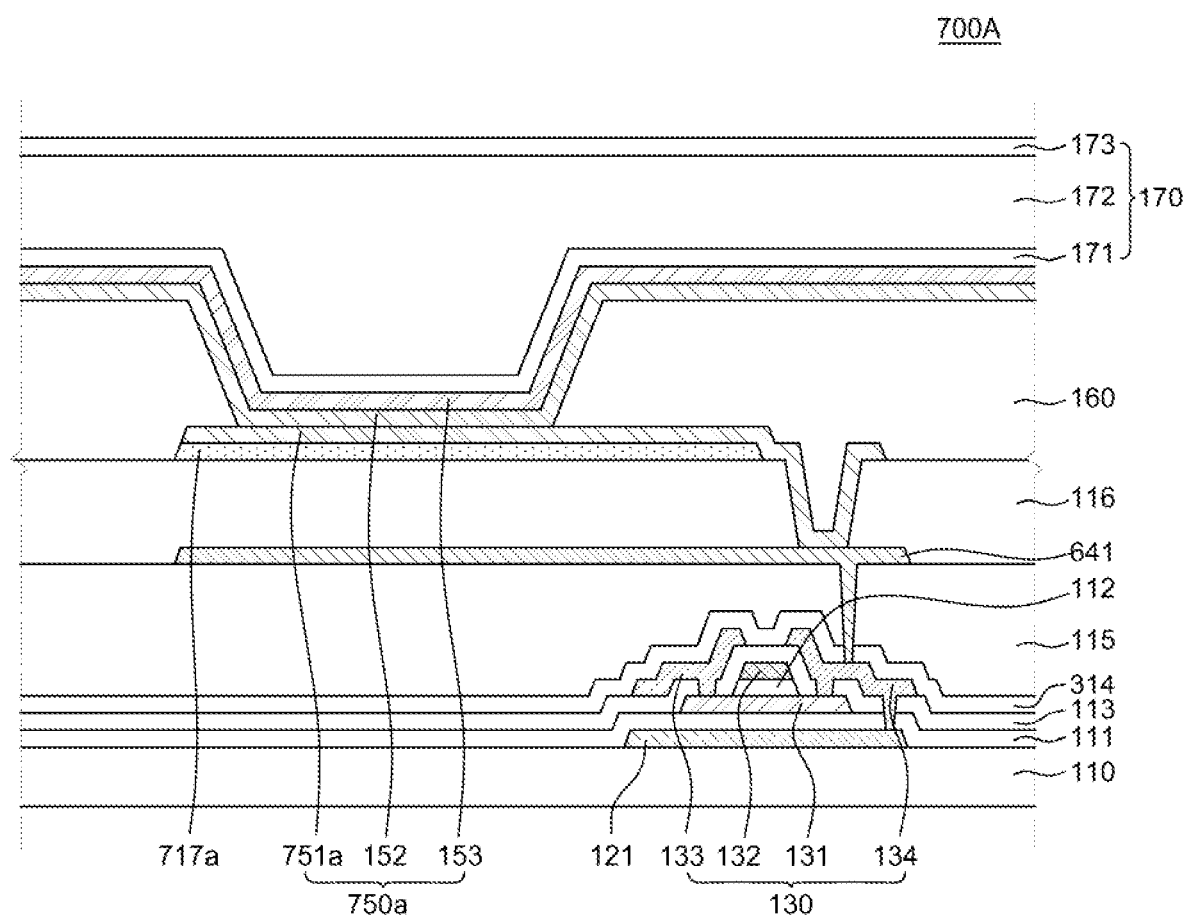
FIGS. 7A and 7B are cross-sectional views of display devices according to various aspects of the present disclosure.
Figure 7B:
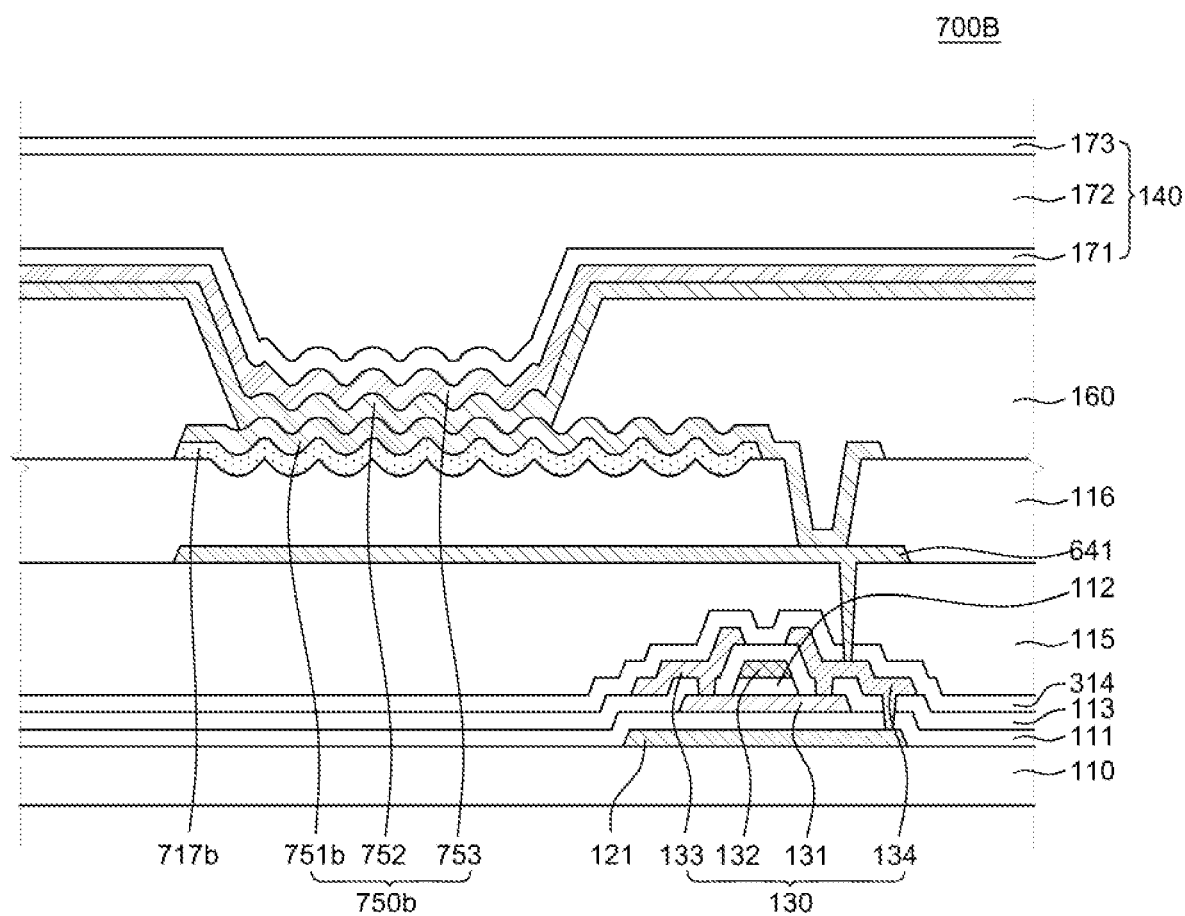

FIGS. 7A and 7B are cross-sectional views of display devices according to various aspects of the present disclosure. Display devices 700A and 700B illustrated in FIGS. 7A and 7B are substantially identical to the display devices 600A and 600B illustrated in FIGS. 6A and 6B, except for hydrogen blocking layers 717*a* and 717*b* and light-emitting elements 750*a* and 750*b*. Therefore, repeated descriptions of the identical components will be omitted.

Referring to FIGS. 7A and 7B, the hydrogen blocking layer 717*a* or 717*b* may be disposed between the second planarization layer 116 and the first electrode 751*a* or 751*b* of the light-emitting element 750*a* or 750*b*. In this case, the hydrogen blocking layer 717*a* or 717*b* may extend from a region in which the hydrogen blocking layer 717*a* or 717*b* overlaps with the bank 160 to a region in which the hydrogen blocking layer 717*a* or 717*b* overlaps with the light-emitting element 750*a* or 750*b*. The hydrogen blocking layers 717*a* and 717*b* may be made of the same material as the hydrogen blocking layer 114 illustrated in FIGS. 1 and 2.

According to the display devices 700A and 700B according to yet another aspect of the present disclosure, the hydrogen blocking layer 717*a* or 717*b* may be disposed to extend to the region corresponding to the light-emitting element 750a or 750b. Therefore, it is possible to increase an area in which the hydrogen blocking layer 717a or 717b may capture hydrogen. In particular, the hydrogen blocking layer 717a or 717b may be disposed between the second planarization layer 116 and the first electrode 751a or 751b and disposed close to the encapsulation unit 170. Therefore, the effect of the hydrogen blocking layer 717a or 717b for blocking hydrogen may be further improved.

The hydrogen blocking layer 717b of the display device 700B according to the aspect of the present disclosure may include a concave-convex pattern. Therefore, an area of the hydrogen blocking layer 717b may increase, thereby further improving the effect of blocking hydrogen.

In addition, the first electrode 751b, the light-emitting layer 752, and the second electrode 753 disposed on an upper portion of the hydrogen blocking layer 717b may also include concave-convex patterns. Therefore, an area of the first electrode 751b may increase, thereby further reducing the overall resistance of the display device 700B. In addition, light directed toward the first electrode 751b may be extracted by the concave-convex pattern of the first electrode 751b, thereby improving efficiency in extracting light.

Figure 8A:
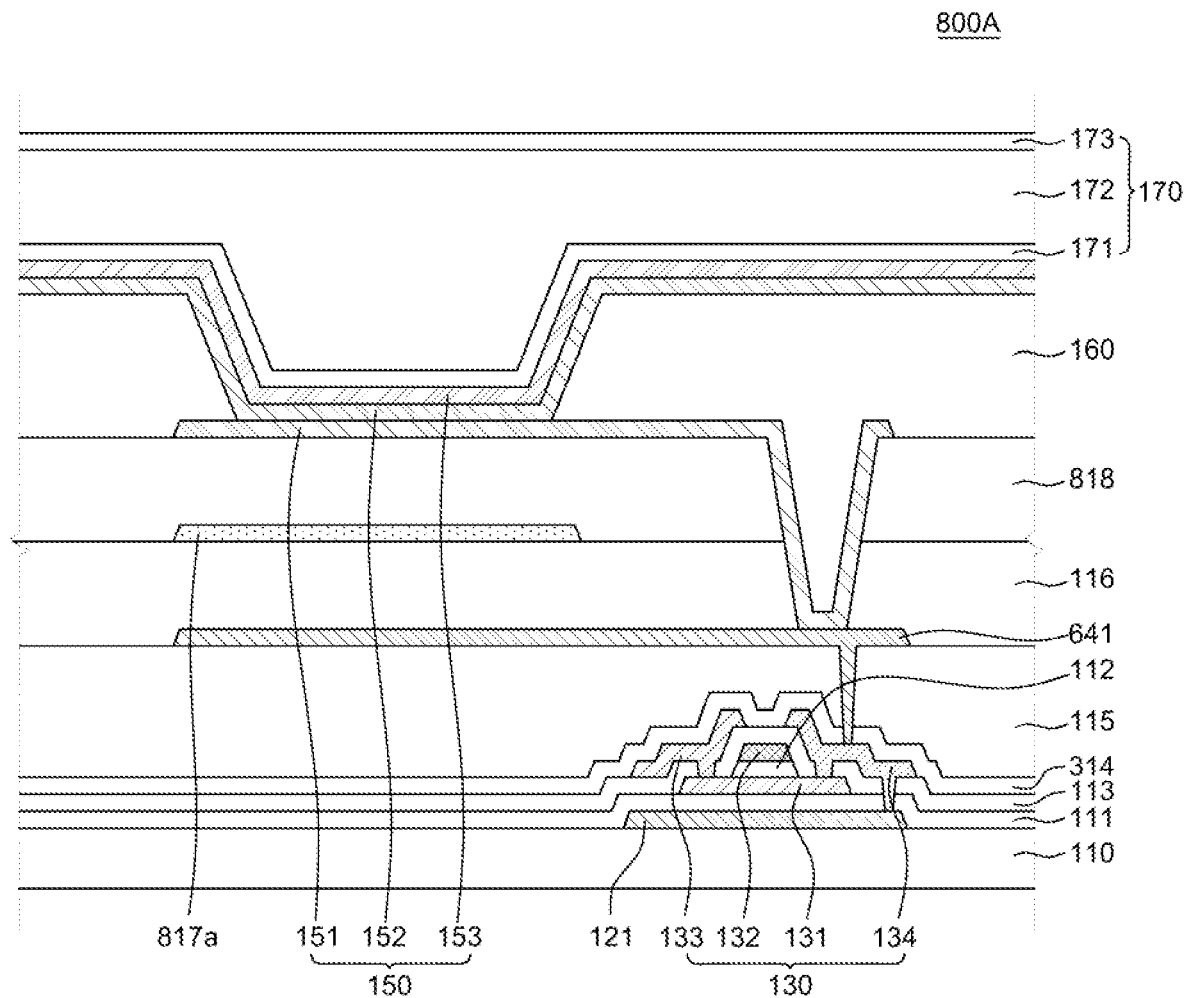
FIGS. 8A and 8B are cross-sectional views of display devices according to various aspects of the present disclosure.
Figure 8B:
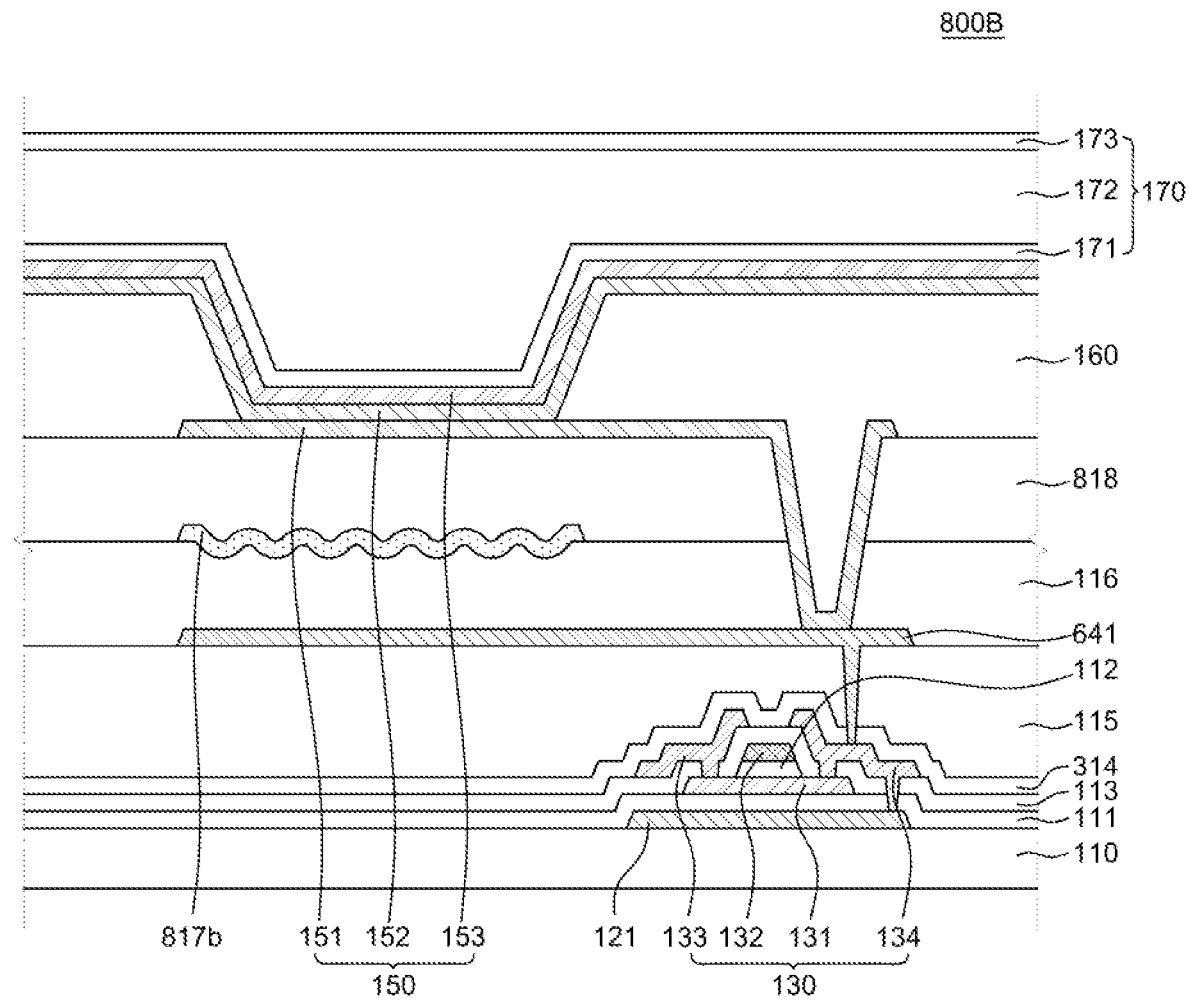

FIGS. 8A and 8B are cross-sectional views of display devices according to various aspects of the present disclosure. Display devices 800A and 800B illustrated in FIGS. 8A and 8B are substantially identical to the display devices 600A and 600B illustrated in FIGS. 6A and 6B, except for hydrogen blocking layers 817a and 817b and a third planarization layer 818. Therefore, repeated descriptions of the identical components will be omitted.

Referring to FIGS. 8A and 8B, the third planarization layer 818 is disposed on the second planarization layer 116. In this case, the hydrogen blocking layer 817a or 817b may be disposed between the second planarization layer 116 and the third planarization layer 818. The hydrogen blocking layer 817a or 817b may be disposed in a region in which the hydrogen blocking layer 817a or 817b overlaps with the light-emitting element 150. The hydrogen blocking layers 817a and 817b may be made of the same material as the hydrogen blocking layer 114 illustrated in FIGS. 1 and 2.

According to the display devices 800A and 800B according to the aspect of the present disclosure, the hydrogen blocking layer 817a or 817b may block hydrogen that is diffused in the horizontal direction in the third planarization layer 818. Therefore, it is possible to inhibit degradation of the transistor 130.

The hydrogen blocking layer 817a or 817b may be disposed between the second planarization layer 116 and the third planarization layer 818. In addition, the connection electrode 641, which is an auxiliary hydrogen blocking layer, may be disposed between the first planarization layer 115 and the second planarization layer 116. That is, three planarization layers 115, 116, and 818 may be provided, and the hydrogen blocking layer 817a or 817b and the connection electrode 641 may be disposed between the planarization layers. Therefore, the hydrogen, which is diffused from the encapsulation unit 170, needs to pass through the three planarization layers 115, 116, and 818, the hydrogen blocking layer 817a or 817b, and the connection electrode 641. Therefore, since hydrogen is hardly diffused, the effect of blocking hydrogen may be improved.

The hydrogen blocking layer 817b of the display device 800B according to the aspect of the present disclosure may include a concave-convex pattern. Therefore, an area of the hydrogen blocking layer 817b may increase, thereby further improving the effect of blocking hydrogen.

Figure 9A:
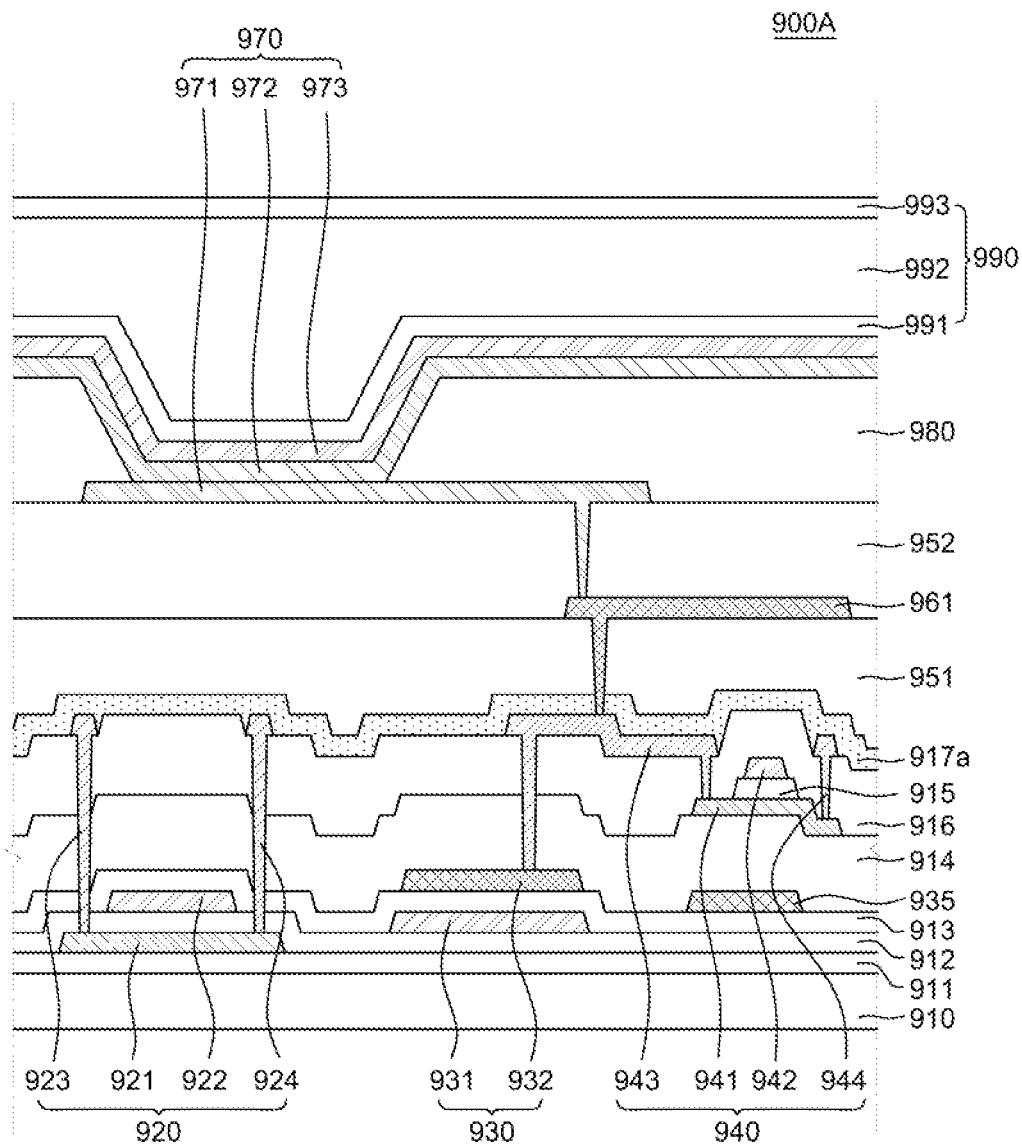
FIGS. 9A and 9E are cross-sectional views of display devices according to various aspects of the present disclosure.

FIG. 9A is a cross-sectional view of a display device according to another aspect of the present disclosure.

Referring to FIG. 9A, a display device 900A according to another aspect of the present disclosure includes a substrate 910, a first transistor 920, a storage capacitor 930, a second transistor 940, a hydrogen blocking layer 917a, a connection electrode 961, planarization layers 951 and 952, a light-emitting element 970, a bank 980, and an encapsulation unit 990. The display device 900A may be implemented as a top-emission type display device, but the present disclosure is not limited thereto.

The substrate 910 may support various constituent elements of the display device 900. The substrate 910 may be made of glass or a plastic material having flexibility. In the case in which the substrate 910 is made of a plastic material, the substrate 910 may be made of polyimide (PI), for example. However, the present disclosure is not limited thereto.

A first buffer layer 911 is disposed on the substrate 910. The first buffer layer 911 may be referred to as a multi-buffer layer or an active buffer layer. The first buffer layer 911 may reduce the amount of moisture or impurities penetrating through the substrate 910. In addition, the first buffer layer 911 may protect the transistors 920 and 940 from impurities such as alkaline ions flowing out of the substrate 910. In addition, the first buffer layer 911 may improve bonding forces between the substrate 910 and the layers formed over an upper portion of the first buffer layer 911. In addition, the first buffer layer 911 may protect a first active layer 921 of the first transistor 920. The first buffer layer 911 may be configured as a single layer or multilayer made of silicon nitride (SiNx) or silicon oxide (SiOx), but the present disclosure is not limited thereto.

Meanwhile, although not illustrated in FIG. 9A, a protective layer, which is similar to the protective layer 121 illustrated in FIG. 2, may be disposed between the substrate 910 and the first buffer layer 911. The protective layer may be disposed to overlap with the transistors 920 and 940, thereby suppressing the occurrence of potential on the surface of the substrate 910 and blocking light introduced from the outside.

The first transistor 920 is disposed over the first buffer layer 911. The first transistor 920 may be an LTPS thin film transistor. The first transistor 920 includes the first active layer 921, a first gate electrode 922, a first source electrode 923, and a first drain electrode 924.

The first active layer 921 is disposed over the first buffer layer 911. The first active layer 921 of the first transistor 920 may include low-temperature poly-silicon (LTPS). The first active layer 921 may be formed by depositing an amorphous silicon (a-Si) material on the first buffer layer 911, forming polysilicon by performing a dehydration process and a crystallization process, and then patterning the polysilicon. The first active layer 921 may include: a channel area configured to overlap with the first gate electrode 922, a source area electrically connected to the first source electrode 923, and a drain area electrically connected to the first drain electrode 924. In this case, the source area and the drain area may be portions where ion doping (impurities doping) is performed on the polysilicon material. The channel area may be a portion which is not subjected to the ion doping and has the remaining polysilicon material.

A first gate insulating layer 912 is disposed on the first active layer 921. The first gate insulating layer 912 may have contact holes through which the first source electrode 923 and the first drain electrode 924 are respectively connected to the source area and the drain area of the first active layer 921. The first gate insulating layer 912 may be configured as a single layer made of silicon nitride (SiNx) or silicon oxide (SiOx) that is an inorganic material. Alternatively, the first gate insulating layer 912 may be configured as a multilayer made of silicon nitride (SiNx) or silicon oxide (SiOx). However, the present disclosure is not limited thereto.

The first gate electrode 922 is disposed on the first gate insulating layer 912. The first gate electrode 922 may be disposed to overlap with the channel area of the first active layer 921. The first gate electrode 922 may be configured as a single layer or multilayer made of any one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The storage capacitor 930 is disposed over the first gate insulating layer 912. The storage capacitor 930 includes a first capacitor electrode 931 and a second capacitor electrode 932.

The first capacitor electrode 931 is disposed on the first gate insulating layer 912. The first capacitor electrode 931 may be configured as a single layer or multilayer made of any one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

A first interlayer insulating layer 913 is disposed on the first gate electrode 922 and the first capacitor electrode 931. The first interlayer insulating layer 913 has contact holes through which the first source electrode 923 and the first drain electrode 924 are in contact with the source area and the drain area of the first active layer 921, respectively. The first interlayer insulating layer 913 may be configured as a single layer made of silicon nitride (SiNx) or silicon oxide (SiOx) that is an inorganic material. Alternatively, the first interlayer insulating layer 913 may be configured as a multilayer made of silicon nitride (SiNx) or silicon oxide (SiOx). However, the present disclosure is not limited thereto.

The second capacitor electrode 932 is disposed on the first interlayer insulating layer 913. The second capacitor electrode 932 may be disposed to overlap with the first capacitor electrode 931. Therefore, the second capacitor electrode 932 and the first capacitor electrode 931 may constitute the storage capacitor. The second capacitor electrode 932 may be configured as a single layer or multilayer made of any one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

An auxiliary electrode 935 is disposed on the first interlayer insulating layer 913 and spaced apart from the second capacitor electrode 932. The auxiliary electrode 935 may be made of the same material and formed by the same process as the second capacitor electrode 932. The auxiliary electrode 935 may be disposed to overlap with a channel area of a second active layer 941 of the second transistor 940 to be described below. Therefore, the auxiliary electrode 935 may be a second gate electrode of the second transistor 940. In addition, the auxiliary electrode 935 may serve to block external light entering the channel area of the second transistor 940. Therefore, the auxiliary electrode 935 may protect the second transistor 940 while improving properties of the second transistor 940.

A second buffer layer 914 is disposed on the first interlayer insulating layer 913, the second capacitor electrode 932, and the auxiliary electrode 935. The second buffer layer 914 may be referred to as an oxide buffer layer. The second buffer layer 914 may be a buffer layer for protecting the second active layer 941 of the second transistor 940. The second buffer layer 914 may have contact holes through which the first source electrode 923 and the first drain electrode 924 respectively come into contact with the source area and the drain area of the first active layer 921. The second buffer layer 914 may be configured as a single layer made of silicon nitride (SiNx) or silicon oxide (SiOx) that is an inorganic material. Alternatively, the second buffer layer 914 may be configured as a multilayer made of silicon nitride (SiNx) or silicon oxide (SiOx). However, the present disclosure is not limited thereto.

The second transistor 940 is disposed over the second buffer layer 914. The second transistor 940 may be an oxide semiconductor thin-film transistor. The second transistor 940 includes a second active layer 941, a second gate electrode 942, a second source electrode 943, and a second drain electrode 944.

The second active layer 941 is disposed on the second buffer layer 914. The second active layer 941 may include an oxide semiconductor. For example, the second active layer 941 may be made of metal oxide, and specifically, include metal oxide such as indium-gallium-zinc-oxide (IGZO), indium-zinc-oxide (IZO), indium-gallium-tin-oxide (IGTO), and indium-gallium-oxide (IGO). The second active layer 941 may be formed by depositing metal oxide on the second buffer layer 914, performing a heat treatment process for stabilization, and then patterning the metal oxide. The second active layer 941 may include: a channel area configured to overlap with the second gate electrode 942, a source area electrically connected to the second source electrode 943, and a drain area electrically connected to the second drain electrode 944. In this case, the source area and the drain area may be portions where metal oxide becomes a conductor, and the channel area is a portion where metal oxide does not become a conductor.

A second gate insulating layer 915 is disposed on the second active layer 941. The second gate insulating layer 915 is a layer for electrically insulating the second active layer 941 and the second gate electrode 942. The second gate insulating layer 915 may be made of an insulating material. As illustrated in FIG. 9A, the second gate insulating layer 915 may be formed on the second active layer 941, patterned to have the same width as the second gate electrode 942. However, the present disclosure is not limited thereto. The second gate insulating layer 915 may be configured as a single layer made of silicon nitride (SiNx) or silicon oxide (SiOx) that is an inorganic material. Alternatively, the second gate insulating layer 915 may be configured as a multilayer made of silicon nitride (SiNx) or silicon oxide (SiOx). However, the present disclosure is not limited thereto.

The second gate electrode 942 is disposed on the second gate insulating layer 915. The second gate electrode 942 is disposed on the second gate insulating layer 915 and overlaps with the channel area of the second active layer 941. The second gate electrode 942 may be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, the second gate electrode 942 may be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

A second interlayer insulating layer 916 is disposed on the second buffer layer 914, the second active layer 941, the second gate insulating layer 915, and the second gate electrode 942. The second interlayer insulating layer 916 may have contact holes through which the source electrodes 923 and 943 and drain electrodes 924 and 944 of the first and second transistors 920 and 940 are connected to the source areas and the drain areas of the first and second active layers 921 and 941. The second interlayer insulating layer 916 may be configured as a single layer made of silicon nitride (SiNx) or silicon oxide (SiOx) that is an inorganic material. Alternatively, the second interlayer insulating layer 916 may be configured as a multilayer made of silicon nitride (SiNx) or silicon oxide (SiOx). However, the present disclosure is not limited thereto.

The first source electrode 923 and the first drain electrode 924 of the first transistor 920 and the second source electrode 943 and the second drain electrode 944 of the second transistor 940 are disposed on the second interlayer insulating layer 916. In this case, the second source electrode 943 may be electrically connected to the second capacitor electrode 932 of the storage capacitor 930. The first source electrode 923, the first drain electrode 924, the second source electrode 943, and the second drain electrode 944 are disposed on the same layer and disposed to be spaced apart from one another. The first source electrode 923, the first drain electrode 924, the second source electrode 943, and the second drain electrode 944 may be made of the same material and formed by the same process. The first source electrode 923 and the first drain electrode 924 are electrically connected to the first active layer 921 through the contact holes of the second interlayer insulating layer 916, the second buffer layer 914, the first interlayer insulating layer 913, and the first gate insulating layer 912. The second source electrode 943 and the second drain electrode 944 are electrically connected to the second active layer 941 through the contact hole of the second interlayer insulating layer 916. The first source electrode 923, the first drain electrode 924, the second source electrode 943, and the second drain electrode 944 may each be made of any one of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. Alternatively, The first source electrode 923, the first drain electrode 924, the second source electrode 943, and the second drain electrode 944 may each be configured as a multilayer made of various metallic materials, for example, molybdenum (Mo), aluminum (Al), chromium (Cr), gold (Au), titanium (Ti), nickel (Ni), neodymium (Nd), copper (Cu), and an alloy of two or more of these metallic materials. However, the present disclosure is not limited thereto.

The hydrogen blocking layer 917a is disposed to overlay the transistors 920 and 940 and the second interlayer insulating layer 916. That is, the hydrogen blocking layer 917a may be a passivation layer for protecting the transistors 920 and 940 and the second interlayer insulating layer 916. The hydrogen blocking layer 917a may be formed by doping an insulating material layer with a hydrogen capture material. The hydrogen blocking layer 917a may completely overlay the second transistor 940 that is an oxide semiconductor thin-film transistor. The hydrogen blocking layer 917a may be formed over the entire surface of the substrate 910. Therefore, the hydrogen blocking layer 917a may inhibit diffusion of hydrogen produced from the encapsulation unit 990 and minimize degradation of the second transistor 940 caused by hydrogen.

The insulating material layer of the hydrogen blocking layer 917a may be configured as a single layer or multilayer made of silicon nitride (SiNx) or silicon oxide (SiOx) or a multilayer made of silicon nitride (SiNx) or silicon oxide (SiOx). In particular, the hydrogen blocking layer 917a may be made of, but not limited to, silicon dioxide ($SiO_2$). The hydrogen capture material of the hydrogen blocking layer 917a may be at least one of boron (B), phosphorus (P), lithium (Li), sodium (Na), potassium (K), rubidium (Rb), cesium (Cs), magnesium (Mg), calcium (Ca), strontium (Sr), barium (Ba), scandium (Sc), yttrium (Y), lutetium (Lu), titanium (Ti), zirconium (Zr), hafnium (Hf), vanadium (V), niobium (Nb), tantalum (Ta), lanthanum (La), cerium (Ce), thorium (Th), praseodymium (Pr), protactinium (Pa), neodymium (Nd), uranium (U), neptunium (Np), samarium (Sm), plutonium (Pu), americium (Am), gadolinium (Gd), terbium (Tb), dysprosium (Dy), holmium (Ho), erbium (Er), thulium (Tm), and ytterbium (Yb).

The planarization layers 951 and 952 are disposed over the transistors 920 and 940 and the hydrogen blocking layer 917a. The planarization layers 951 and 952 may include a first planarization layer 951 and a second planarization layer 952. The planarization layers 951 and 952 may each be made of any one of acrylic resin, epoxy resin, phenolic resin, polyamide-based resin, polyimide-based resin, unsaturated polyester-based resin, polyphenylene-based resin, polyphenylene sulfide-based resin, benzocyclobutene, and photoresist. However, the present disclosure is not limited thereto.

The first planarization layer 951 is disposed on the hydrogen blocking layer 917a. The first planarization layer 951 is an insulating layer that serves to protect the transistors 920 and 940 and flatten upper portions of the transistors 920 and 940. The first planarization layer 951 has a contact hole through which the second source electrode 943 of the transistor 940 is exposed. FIG. 9A illustrates that the first planarization layer 951 has the contact hole through which the second source electrode 943 is exposed. However, the present disclosure is not limited thereto. For example, the first planarization layer 951 may have a contact hole through which the second drain electrode 944 is exposed.

The connection electrode 961 is disposed on the first planarization layer 951. The connection electrode 961 may serve to electrically connect the second transistor 940 and the light-emitting element 970. The connection electrode 961 is electrically connected to the second source electrode 943 of the second transistor 940 through the contact holes formed in the first planarization layer 951 and the hydrogen blocking layer 917a. The connection electrode 961 may be configured as a single layer or multilayer made of any one of molybdenum (Mo), copper (Cu), titanium (Ti), aluminum (Al), chromium (Cr), gold (Au), nickel (Ni), neodymium (Nd), and an alloy thereof.

The second planarization layer 952 is disposed on the first planarization layer 951. The second planarization layer 952 is an insulating layer that serves to flatten an upper portion of the first planarization layer 951 and an upper portion of the connection electrode 961. The second planarization layer 952 has a contact hole through which the connection electrode 961 is exposed.

The light-emitting element 970 is disposed over the second planarization layer 952. The light-emitting element 970 includes a first electrode 971 electrically connected to the second source electrode 943 of the second transistor 940, a light-emitting layer 972 disposed on the first electrode 971, and a second electrode 973 formed on the light-emitting layer 972.

The first electrode 971 is disposed on the second planarization layer 952. The first electrode 971 is disposed to correspond to each of the plurality of subpixels SP. The first electrode 971 may be an anode of the light-emitting element 970. The first electrode 971 may be electrically connected to the second source electrode 943 of the second transistor 940 through the connection electrode 961. However, the first electrode 971 may be electrically connected to the second drain electrode 944 of the second transistor 940 depending on the type of the second transistor 940, a method of designing the drive circuit, and the like.

In this case, because the first electrode 971 supplies positive holes to the light-emitting layer 972, the first electrode 971 may be made of an electrically conductive material having a high work function. The first electrode 971 may have a multilayered structure including a transparent conductive film and an opaque conductive film having high reflection efficiency. The transparent conductive film may be made of a material such as indium tin oxide (ITO) or indium zinc oxide (IZO) having a comparatively large work function value. The opaque conductive film may have a single-layered or multilayered structure made of Al, Ag, Cu, Pb, Mo, Ti, or an alloy thereof. However, the material of the first electrode 971 is not limited thereto.

The bank 980 is disposed on the second planarization layer 952 and the first electrode 971. The bank 980 may be formed on the second planarization layer 952 and cover an edge of the first electrode 971. The bank 980 is an insulating layer disposed between the plurality of subpixels in order to divide the plurality of subpixels SP. The bank 980 may be made of an organic insulating material. For example, the bank 980 may be made of, but not limited to, polyimide-based resin, acryl-based resin, or benzocyclobutene (BCB)-based resin.

The light-emitting layer 972 is disposed on the first electrode 971 and the bank 980. The light-emitting layer 972 may be formed over the entire surface of the substrate 910. That is, the light-emitting layer 972 may be a common layer formed in common over the plurality of subpixels SP. The light-emitting layer 972 may be an organic layer that emits light with a particular color. For example, the light-emitting layer 972 may be one of a red light-emitting layer, a green light-emitting layer, a blue light-emitting layer, and a white light-emitting layer. When the light-emitting layer 972 is configured as a white light-emitting layer, a color filter may further be disposed over the light-emitting element 970. The light-emitting layer 972 may further include various layers such as a hole transport layer, a hole injection layer, a hole blocking layer, an electron injection layer, an electron blocking layer, and an electron transport layer.

The second electrode 973 is disposed on the light-emitting layer 972. The second electrode 973 may be a single layer formed over the entire surface of the substrate 910. That is, the second electrode 973 may be a common layer formed in common over the plurality of subpixels SP. Since the second electrode 973 supplies the electrons to the light-emitting layer 972, the second electrode 973 may be made of an electrically conductive material with a low work function. For example, the second electrode 973 may be made of a transparent electrically conductive material such as indium tin oxide (ITO) and indium zinc oxide (IZO) or made of a metal alloy such as MgAg or an ytterbium (Yb) alloy. The second electrode 973 may further include a metal doping layer. However, the present disclosure is not limited thereto.

The encapsulation unit 990 is disposed over the light-emitting element 970. For example, the encapsulation unit 990 is disposed over the second electrode 973 and covers the light-emitting element 970. The encapsulation unit 990 protects the light-emitting element 970 from moisture and oxygen that penetrate into the display device 900A from the outside. The encapsulation unit 990 may have a structure in which inorganic layers and organic layers are alternately stacked. The encapsulation unit 990 includes a first encapsulation layer 991, a particle covering layer 992, and a second encapsulation layer 993.

The first encapsulation layer 991 may be disposed on the second electrode 973 and inhibit penetration of moisture or oxygen. The first encapsulation layer 991 may be made of an inorganic material such as silicon nitride ($SiN_x$), silicon oxynitride ($SiN_xO_y$), silicon oxide ($SiO_x$), or aluminum oxide ($Al_yO_z$). However, the present disclosure is not limited thereto.

The particle covering layer 992 is disposed on the first encapsulation layer 991 and flattens an upper surface of the first encapsulation layer 991. In addition, the particle covering layer 992 may cover foreign substances or particles that may be produced during the manufacturing process. The particle covering layer 992 may be made of an organic material, for example, silicon oxycarbon ($SiO_xC_z$) or acrylic or epoxy-based resin. However, the present disclosure is not limited thereto.

The second encapsulation layer 993 may be disposed on the particle covering layer 992 and inhibit penetration of moisture or oxygen, like the first encapsulation layer 991. The second encapsulation layer 993 may be made of an inorganic material such as silicon nitride ($SiN_x$), silicon oxynitride ($SiN_xO_y$), silicon oxide ($SiO_x$), or aluminum oxide ($Al_yO_z$). However, the present disclosure is not limited thereto. The second encapsulation layer 993 may be made of the same material as the first encapsulation layer 991. Alternatively, the second encapsulation layer 993 may be made of a material different from a material of the first encapsulation layer 991.

The display device 900A according to the aspect of the present disclosure include the hydrogen blocking layer 917a made by being doped with the hydrogen capture material. In particular, the hydrogen blocking layer 917a may be disposed between the second transistor 940 and the planarization layers 951 and 952. That is, a passivation layer, which is one of the insulating layers of the display device 900A, may be configured as the hydrogen blocking layer 917a. Therefore, even if the display device 900A includes the hydrogen blocking layer 917a, the design of electrodes or lines is not affected. Therefore, it is possible to suppress the degradation of the second transistor 940 while maintaining the properties of the display device 900A without change. In addition, the hydrogen blocking layer 917a may be formed over the entire surface of the substrate 110. Therefore, the hydrogen blocking layer 917a may effectively inhibit hydrogen from being diffused downward.

According to the display device 900A according to the aspect of the present disclosure, the connection electrode 961 may serve as an auxiliary hydrogen blocking layer. Specifically, the connection electrode 961 may be made of titanium (Ti) that is a hydrogen capture material. The connection electrode 961 may overlap with the second transistor 940 and block the movement of the hydrogen from the encapsulation unit 990 toward the second transistor 940. As a result, the connection electrode 961 and the hydrogen blocking layer 917a may doubly inhibit hydrogen from being diffused toward the second transistor 940. Therefore, the quality of the display device 900A may be further improved.

FIGS. 9B to 9E are cross-sectional views of display devices according to various aspects of the present disclosure. Display devices 900B, 900C, 900D, and 900E illustrated in FIGS. 9B to 9E are substantially identical to the display device 900A illustrated in FIG. 9A, except for hydrogen blocking layers 916b, 915c, 951d, and 952e. Therefore, repeated descriptions of the identical components will be omitted.

Meanwhile, FIGS. 9B to 9E illustrate that the first planarization layer 951 is disposed over the transistors 920 and 940 and the second interlayer insulating layer 916. However, a passivation layer may be disposed below the first planarization layer 951. The passivation layer may be disposed to overlay the transistors 920 and 940 and the second interlayer insulating layer 916. The passivation layer may be configured as a single layer made of silicon nitride (SiNx) or silicon oxide (SiOx) that is an inorganic material. Alternatively, the passivation layer may be configured as a multi-layer made of silicon nitride (SiNx) or silicon oxide (SiOx). However, the present disclosure is not limited thereto.

Figure 9B:
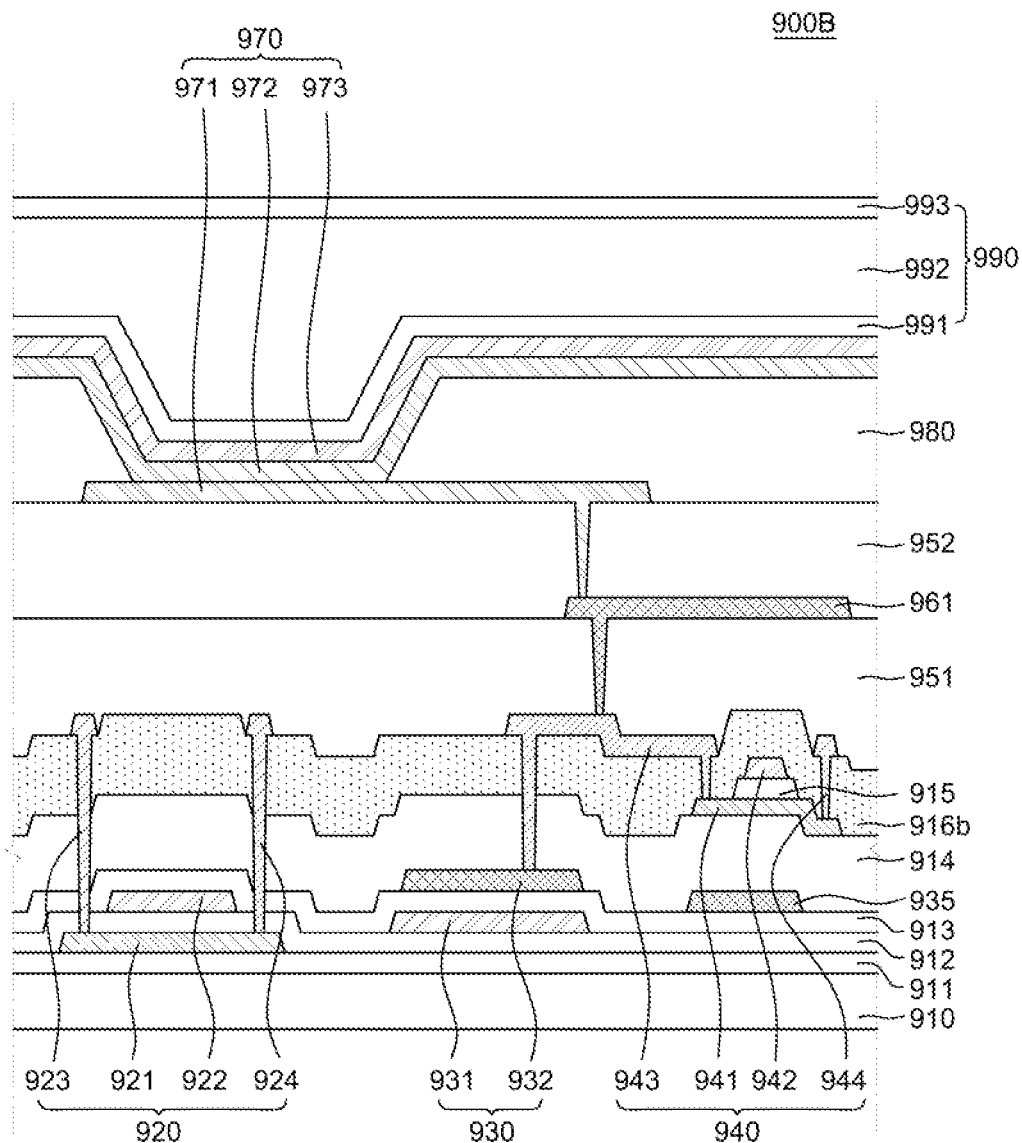

Referring to FIG. 9B, the hydrogen blocking layer 916b of the display device 900B according to the aspect of the present disclosure may be an interlayer insulating layer. Specifically, the hydrogen blocking layer 916b is disposed to overlay the second buffer layer 914, the second active layer 941, the second gate insulating layer 915, and the second gate electrode 942. In addition, the source electrodes 923 and 943 and the drain electrodes 924 and 944 may be disposed on the hydrogen blocking layer 916b. The hydrogen blocking layer 916b may completely overlay the second active layer 941 and be formed over the entire surface of the substrate 910. Therefore, the hydrogen blocking layer 916b may inhibit the degradation of the second active layer 941 caused by the diffusion of hydrogen. The hydrogen blocking layer 916b may be made of the same material as the hydrogen blocking layer 917a illustrated in FIG. 9A.

Figure 9C:
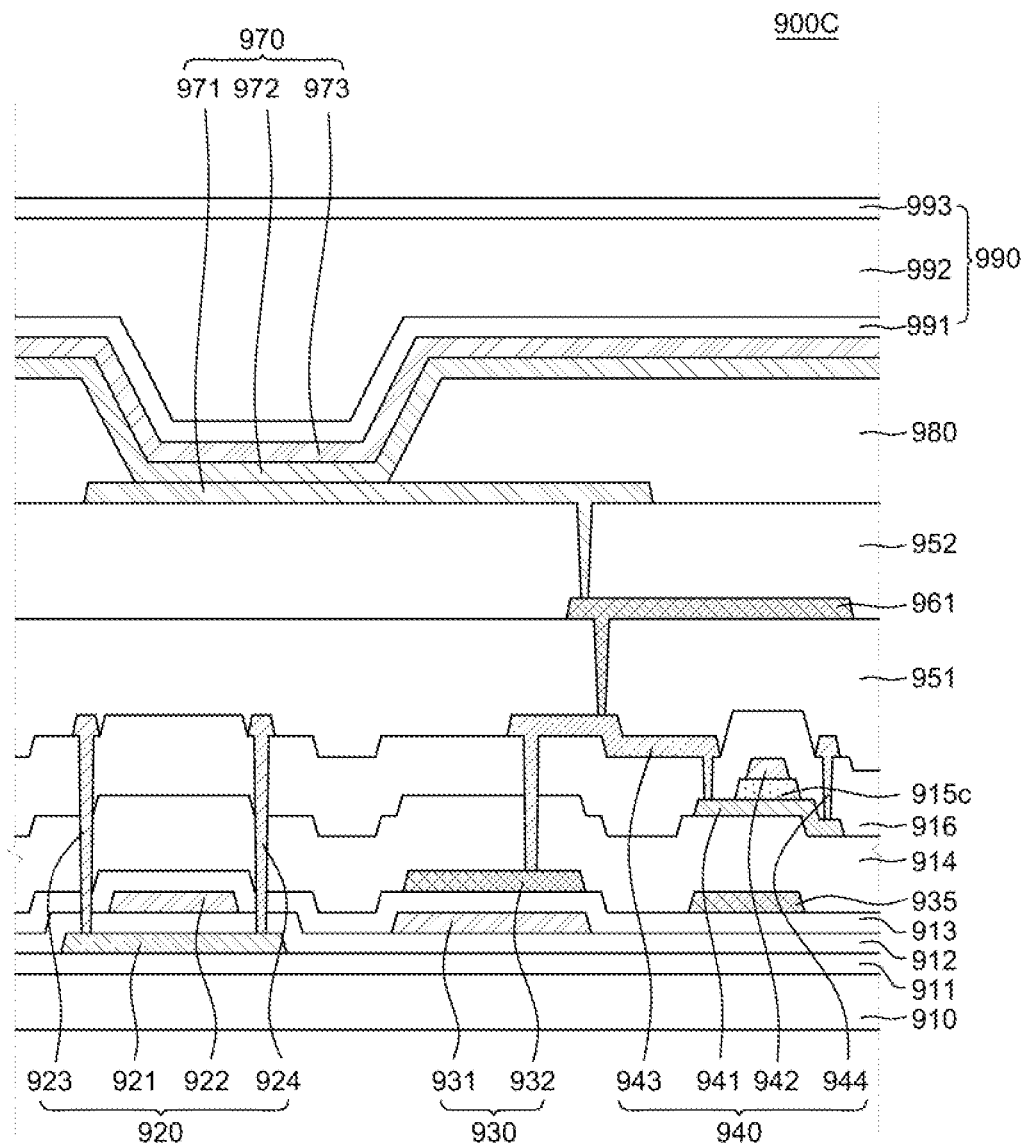

Referring to FIG. 9C, the hydrogen blocking layer 915c of the display device 900C according to the aspect of the present disclosure may be a gate insulating layer. Specifically, the hydrogen blocking layer 915c may be disposed to cover the channel area of the second active layer 941 while overlapping with the second gate electrode 942. Therefore, the hydrogen blocking layer 915c may inhibit the degradation of the second active layer 941 caused by the diffusion of hydrogen. The hydrogen blocking layer 915c may be made of the same material as the hydrogen blocking layer 917a illustrated in FIG. 9A.

Figure 9D:
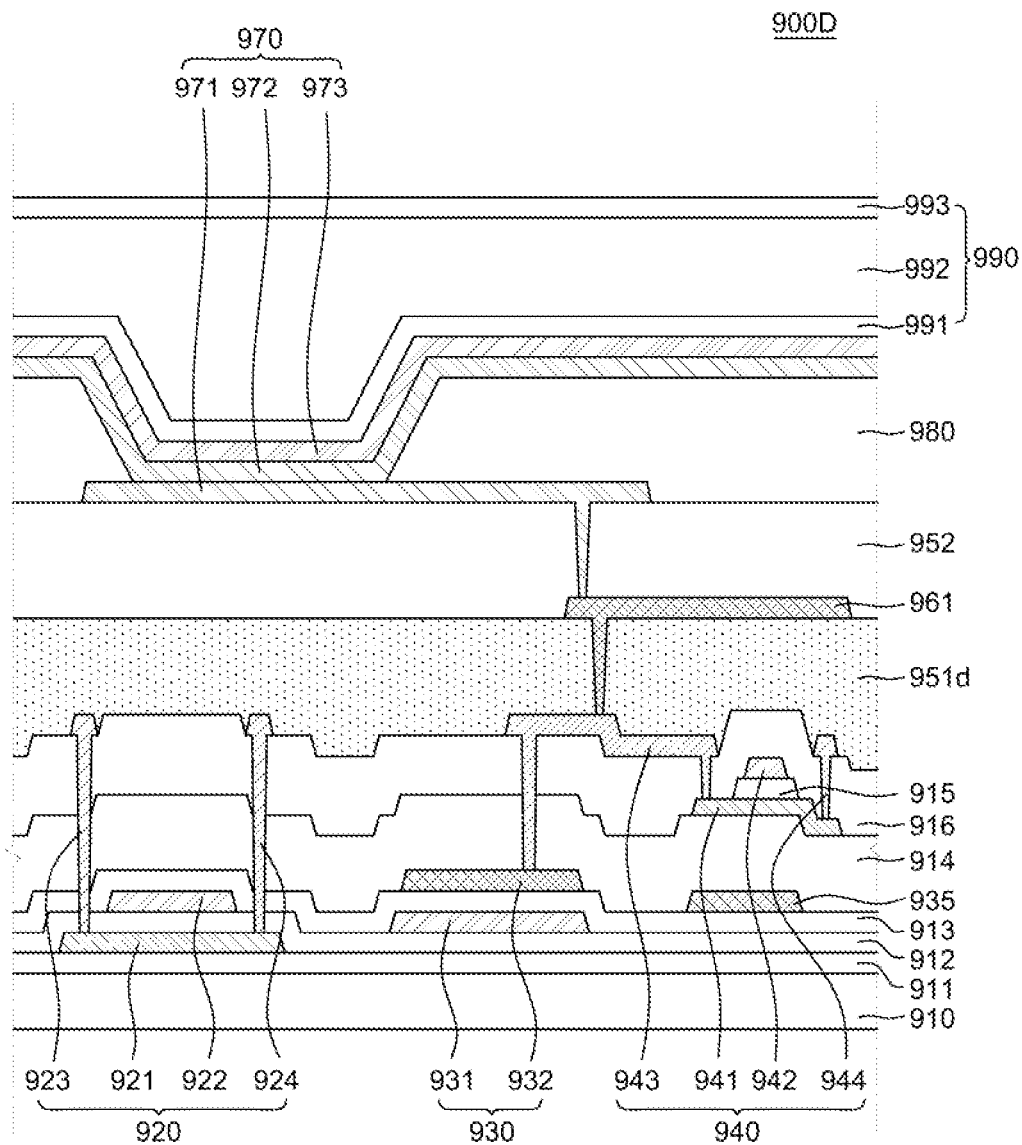

Referring to FIG. 9D, the hydrogen blocking layer 951d of the display device 900D according to the aspect of the present disclosure may be a first planarization layer. Specifically, the hydrogen blocking layer 951d is disposed to overlay the transistors 920 and 940 and the second interlayer insulating layer 916. The hydrogen blocking layer 951d may be formed over the entire surface of the substrate 910. Therefore, the hydrogen blocking layer 951d may inhibit the degradation of the second active layer 941 caused by the diffusion of hydrogen. The hydrogen blocking layer 951d may be made of the same material as the hydrogen blocking layer 917a illustrated in FIG. 9A.

Figure 9E:
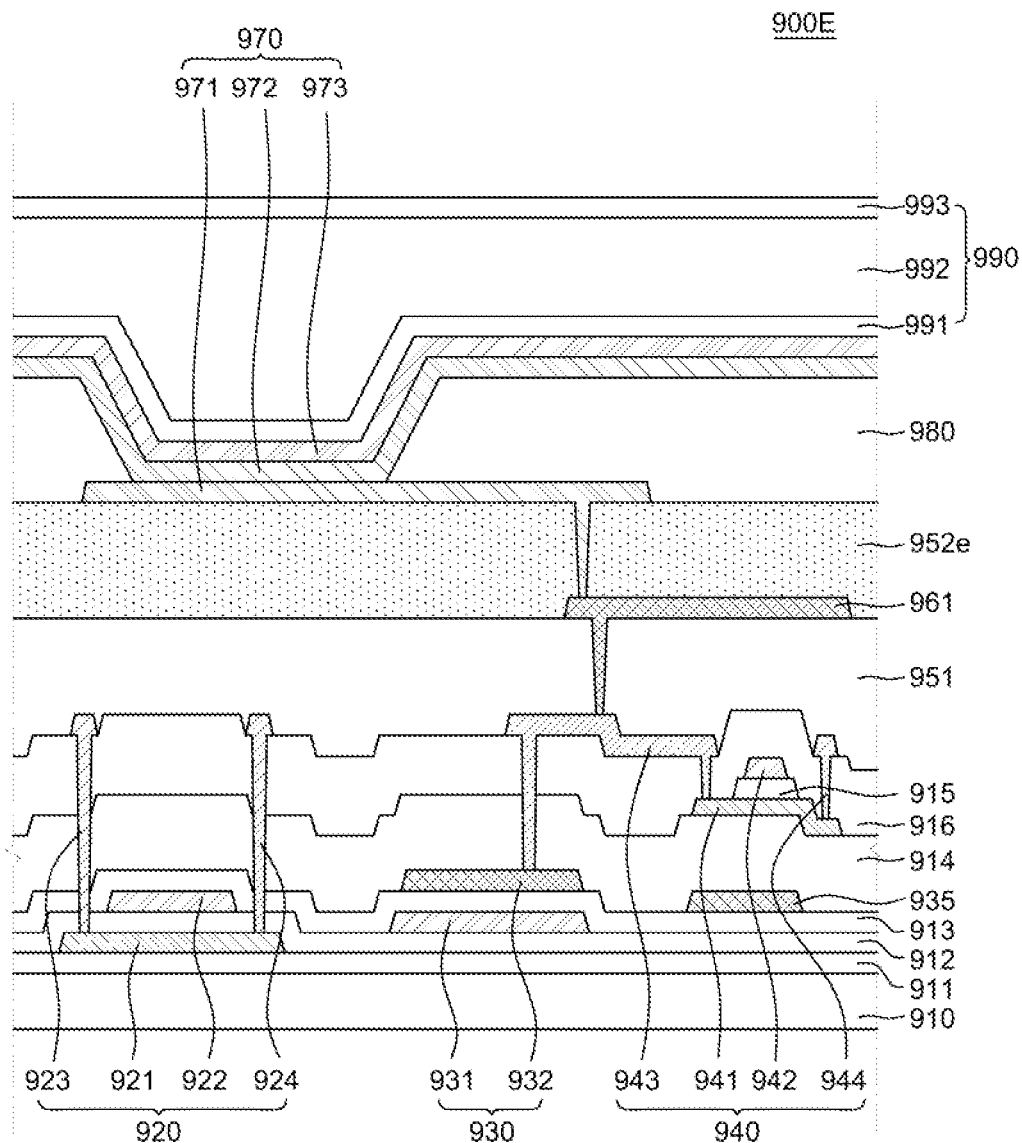

Referring to FIG. 9E, the hydrogen blocking layer 952e of the display device 900E according to the aspect of the present disclosure may be a second planarization layer. Specifically, the hydrogen blocking layer 952e is disposed to cover the first planarization layer 951. The hydrogen blocking layer 952e may be formed over the entire surface of the substrate 910. Therefore, the hydrogen blocking layer 952e may inhibit the degradation of the second active layer 941 caused by the diffusion of hydrogen. The hydrogen blocking layer 952e may be made of the same material as the hydrogen blocking layer 917a illustrated in FIG. 9A.

As illustrated in FIGS. 9A to 9E, the hydrogen blocking layers 917a, 916b, 915c, 951d, and 952e may each be one of various insulating layers of the display devices 900A, 900B, 900C, 900D, and 900E. In particular, the hydrogen blocking layers 917a, 916b, 915c, 951d, and 952e may each be one of the insulating layers disposed between the light-emitting element 970 and the second active layer 941 of the second transistor 940 which is an oxide semiconductor thin-film transistor. Therefore, it is possible to minimize the penetration of hydrogen, which is diffused from the first encapsulation layer 991 and the second encapsulation layer 993 of the encapsulation unit 990, into the second transistor 940.

Meanwhile, FIGS. 9A to 9E illustrate that only the single insulating layer is configured as the hydrogen blocking layer 917a, 916b, 915c, 951d, or 952e. However, the present disclosure is not limited thereto. For example, in some instances, the display device may complexly include the plurality of hydrogen blocking layers 917a, 916b, 915c, 951d, and 952e.

Figure 10A:
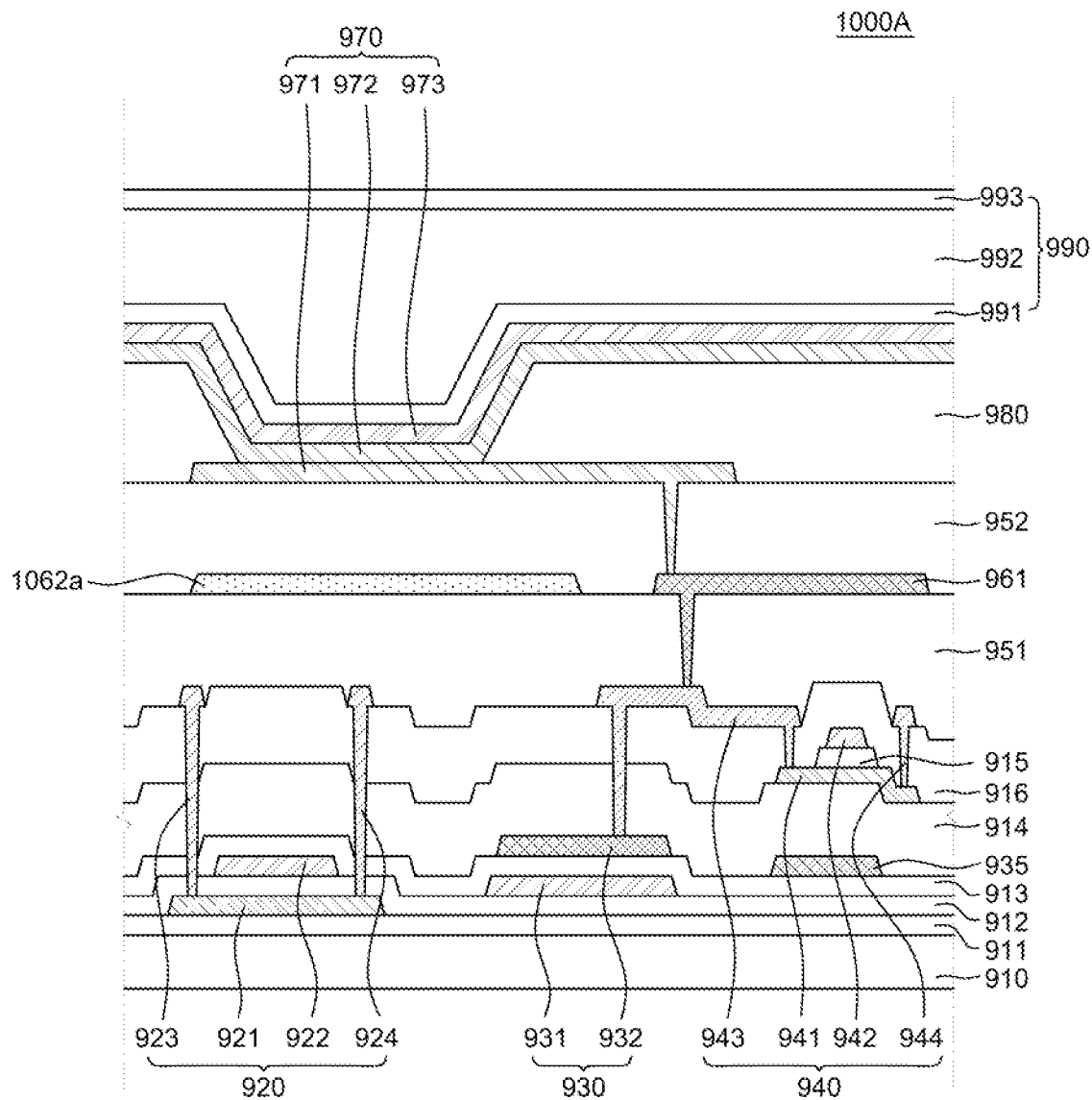
FIGS. 10A and 10B are cross-sectional views of display devices according to various aspects of the present disclosure.
Figure 10B:
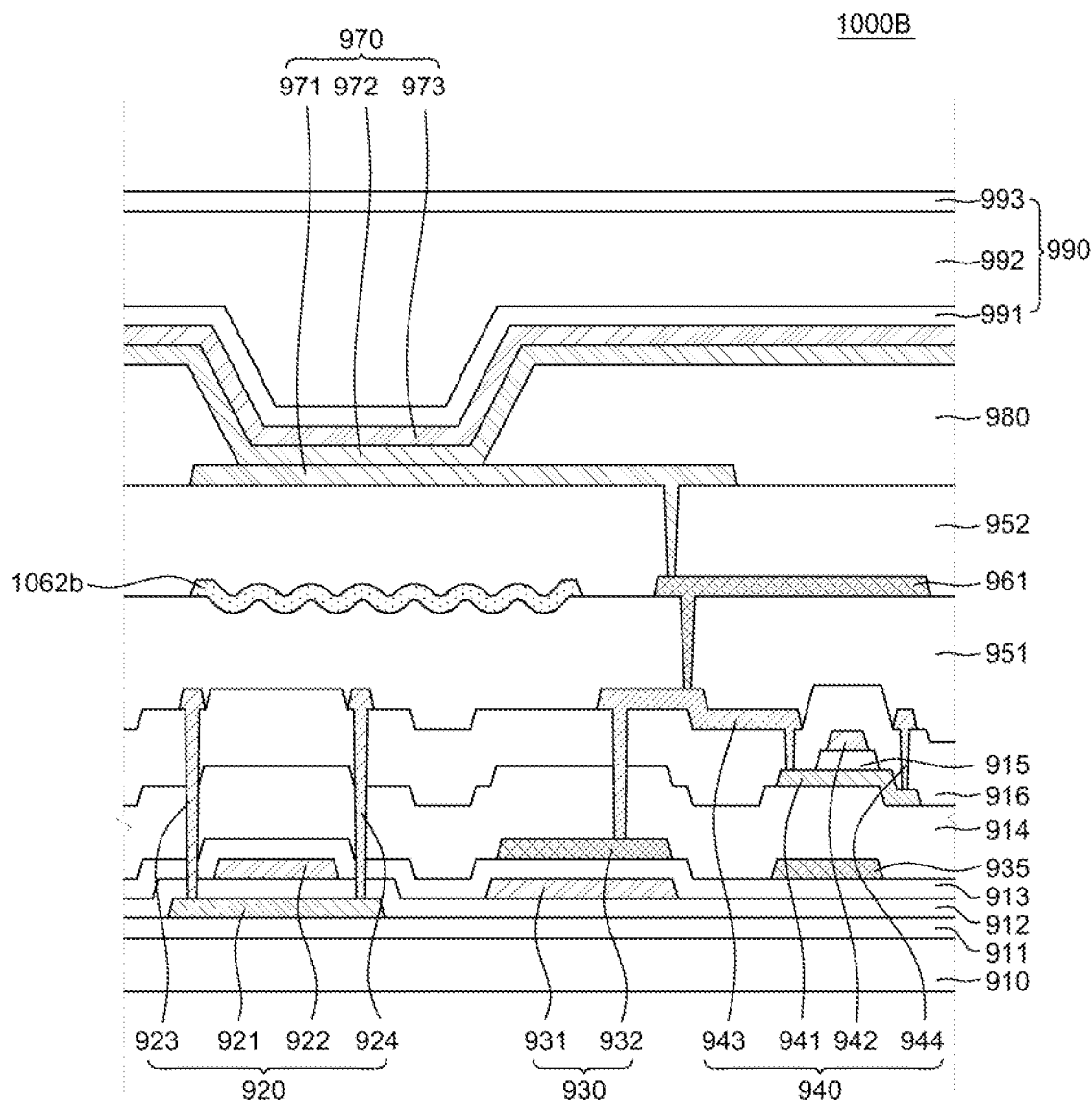

FIGS. 10A and 10B are cross-sectional views of display devices according to various aspects of the present disclosure. Display devices 1000A and 1000B illustrated in FIGS. 10A and 10B are substantially identical to the display device 900A illustrated in FIG. 9A, except for hydrogen blocking layers 1062a and 1062b. Therefore, repeated descriptions of the identical components will be omitted.

Referring to FIGS. 10A and 10B, the display devices 1000A and 1000B according to another aspect of the present disclosure respectively include hydrogen blocking layers 1062a and 1062b disposed between the first planarization layer 951 and the second planarization layer 952. The hydrogen blocking layers 1062a and 1062b are disposed on the same layer as the connection electrode 961. In addition, the hydrogen blocking layers 1062a and 1062b may be disposed in a region in which the hydrogen blocking layers 1062a and 1062b overlap with the light-emitting element 970. The hydrogen blocking layers 1062a and 1062b may be made of the same material as the hydrogen blocking layer 917a illustrated in FIG. 9A.

As illustrated in FIG. 10A, the hydrogen blocking layer 1062a may have a flat surface. Alternatively, as illustrated in FIG. 10B, the hydrogen blocking layer 1062b may include a concave-convex pattern. FIG. 10B illustrates that the hydrogen blocking layer 1062b has a wavy shape, but the present disclosure is not limited thereto. For example, a cross-section of the hydrogen blocking layer 1062b may have various concave-convex patterns such as a circular shape, an elliptical shape, or a polygonal shape. Alternatively, the hydrogen blocking layer 1062b may have various structures such as a mesh pattern or a honeycomb pattern.

In the display devices 1000A and 1000B according to the aspect of the present disclosure, the separate hydrogen blocking layer 1062a or 1062b may be disposed between the first planarization layer 951 and the second planarization layer 952, thereby inhibiting hydrogen from being diffused toward the second transistor 940. In particular, even if hydrogen, which is not blocked by the connection electrode 961, is diffused in the horizontal direction along the second planarization layer 952, the hydrogen blocking layers 1062a and 1062b may minimize the amount of hydrogen diffused from the second planarization layer 952 to the first planarization layer 951. Therefore, it is possible to more effectively inhibit degradation of the second transistor 940.

The hydrogen blocking layers 1062a and 1062b may be formed by doping an insulating material layer with a hydrogen capture material. Therefore, even if the display devices 1000A and 1000B respectively have the separate hydrogen blocking layers 1062a and 1062b, the design of electrodes or lines is not affected. Therefore, it is possible to suppress the degradation of the second transistor 940 while maintaining the properties of the display devices 1000A and 1000B without change.

The hydrogen blocking layer 1062b of the display device 1000B according to the aspect of the present disclosure may include a concave-convex pattern. Therefore, it is possible to increase an area in which the hydrogen blocking layer 1062b may capture hydrogen. Therefore, the effect of the hydrogen blocking layer 1062b for blocking hydrogen may be further improved.

Figure 11A:
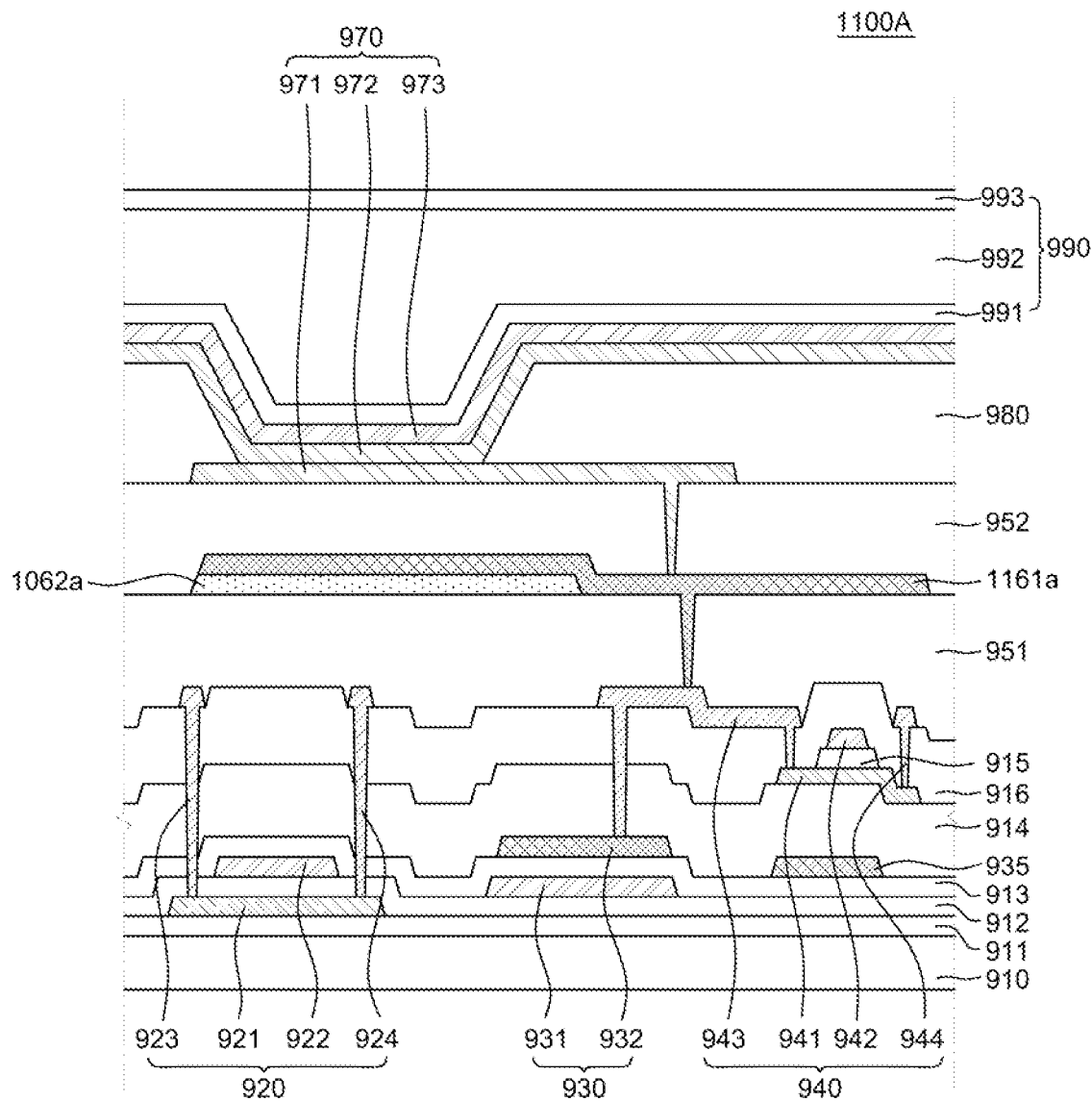
FIGS. 11A and 11B are cross-sectional views of display devices according to various aspects of the present disclosure.
Figure 11B:
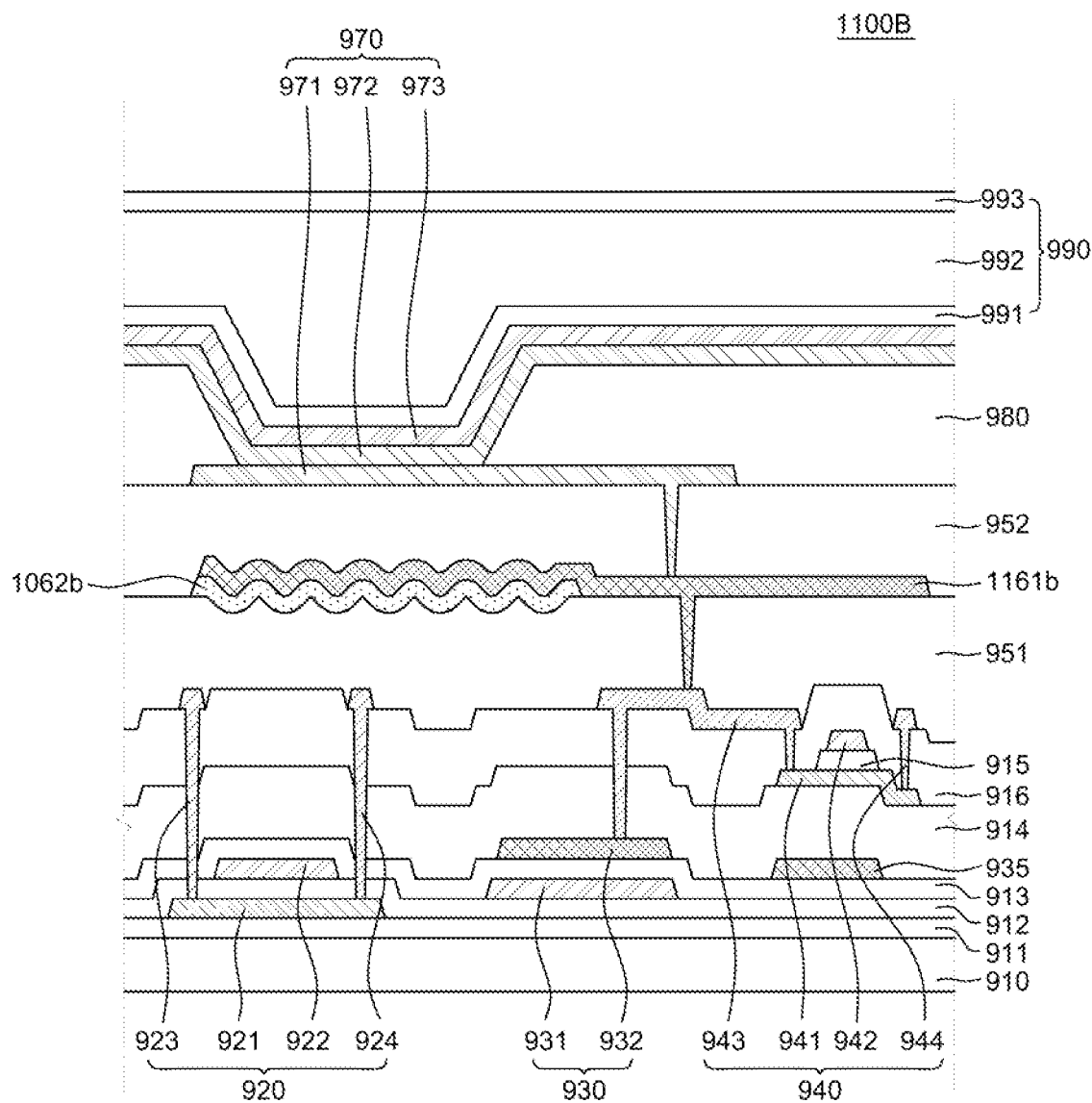

FIGS. 11A and 11B are cross-sectional views of display devices according to various aspects of the present disclosure. Display devices 1100A and 1100B illustrated in FIGS. 11A and 11B are substantially identical to the display devices 1000A and 1000B illustrated in FIGS. 10A and 10B, except for connection electrodes 1161a and 1161b. Therefore, repeated descriptions of the identical components will be omitted.

Referring to FIGS. 11A and 11B, the connection electrodes 1161a and 1161b of the display devices 1100A and 1100B according to another aspect of the present disclosure are disposed to cover the hydrogen blocking layers 1062a and 1062b, respectively. Specifically, the connection electrode 1161a or 1161b may extend from a region in which the connection electrode 1161a or 1161b overlaps with the second transistor 940 to a region in which the connection electrode 1161a or 1161b overlaps with the light-emitting element 970.

According to the display device 1100A and 1100B according to the aspect of the present disclosure, the connection electrode 1161a or 1161b, which serves as an auxiliary hydrogen blocking layer, may extend to a region in which the connection electrode 1161a or 1161b overlaps with the hydrogen blocking layer 1062a or 1062b. Therefore, even if hydrogen is diffused in the horizontal direction along the second planarization layer 952, the connection electrode 1161a or 1161b may minimize the diffusion of hydrogen from the second planarization layer 952 to the first planarization layer 951.

The connection electrode 1161a or 1161b may be disposed to overlap with the hydrogen blocking layer 1062a or 1062b while directly adjoining the hydrogen blocking layer 1062a or 1062b. Therefore, the connection electrode 1161a or 1161b and the hydrogen blocking layer 1062a or 1062b may doubly block hydrogen, thereby more effectively suppressing degradation of the second transistor 940.

According to the display device 1100A and 1100B according to the aspect of the present disclosure, overall resistance may be reduced by the connection electrode 1161a and 1161b. Specifically, the connection electrode 1161a or 1161b electrically connects the second transistor 940 and the light-emitting element 970. In this case, since the connection electrode 1161a or 1161b overlaps with both the second transistor 940 and the light-emitting element 940, an area of the connection electrode 1161a or 1161b may increase. Therefore, the resistance of the display device 1100A and 1100B may be reduced, thereby improving electric power consumption.

The connection electrode 1161b of the display device 1100B according to the aspect of the present disclosure may include a concave-convex pattern consistent with the concave-convex pattern of the hydrogen blocking layer 1062b. Therefore, an area of the connection electrode 1161b may further increase, thereby further improving the effect of blocking hydrogen. In addition, the area of the connection electrode 1161b may further increase, thereby further reducing the overall resistance of the display device 1100B.

Meanwhile, FIG. 11B illustrates that the connection electrode 1161b is disposed on an upper portion of the hydrogen blocking layer 1062b. However, a low-potential power line VSS may be disposed on the upper portion of the hydrogen blocking layer 1062b, instead of the connection electrode 1161b. In this case, the resistance of the low-potential power line VSS may be reduced, thereby coping with low-potential voltage rising (VSS rising). Therefore, the drive voltage and electric power consumption may be reduced, and the brightness deviation of the display device 1100B may be improved. Alternatively, an area of the low-potential power line VSS may be reduced as the resistance of the low-potential power line VSS is kept constant. Therefore, it is possible to improve a degree of design freedom of electrodes or lines disposed on the same layer as the low-potential power line VSS.

Figure 12A:
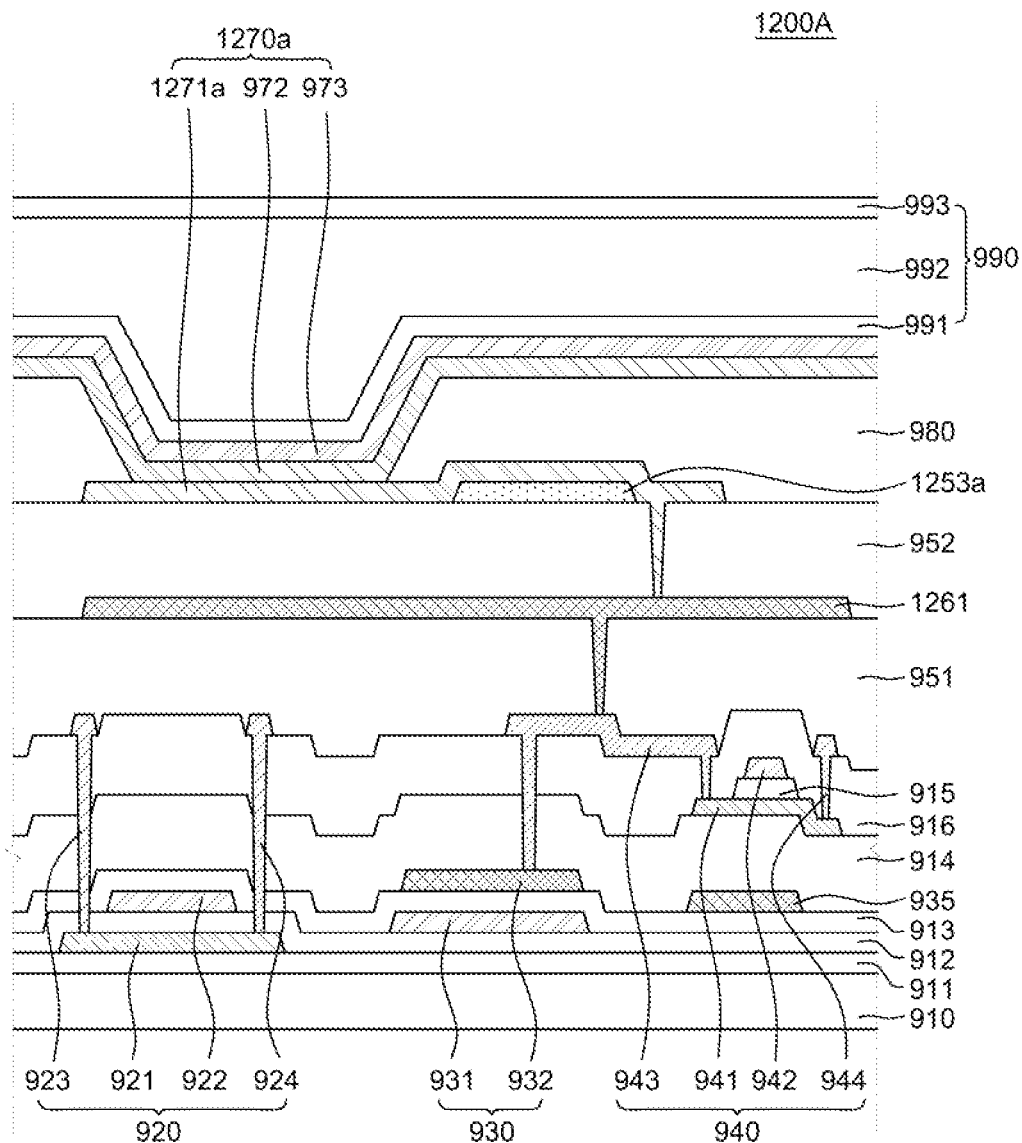
FIGS. 12A and 12B are cross-sectional views of display devices according to various aspects of the present disclosure.
Figure 12B:
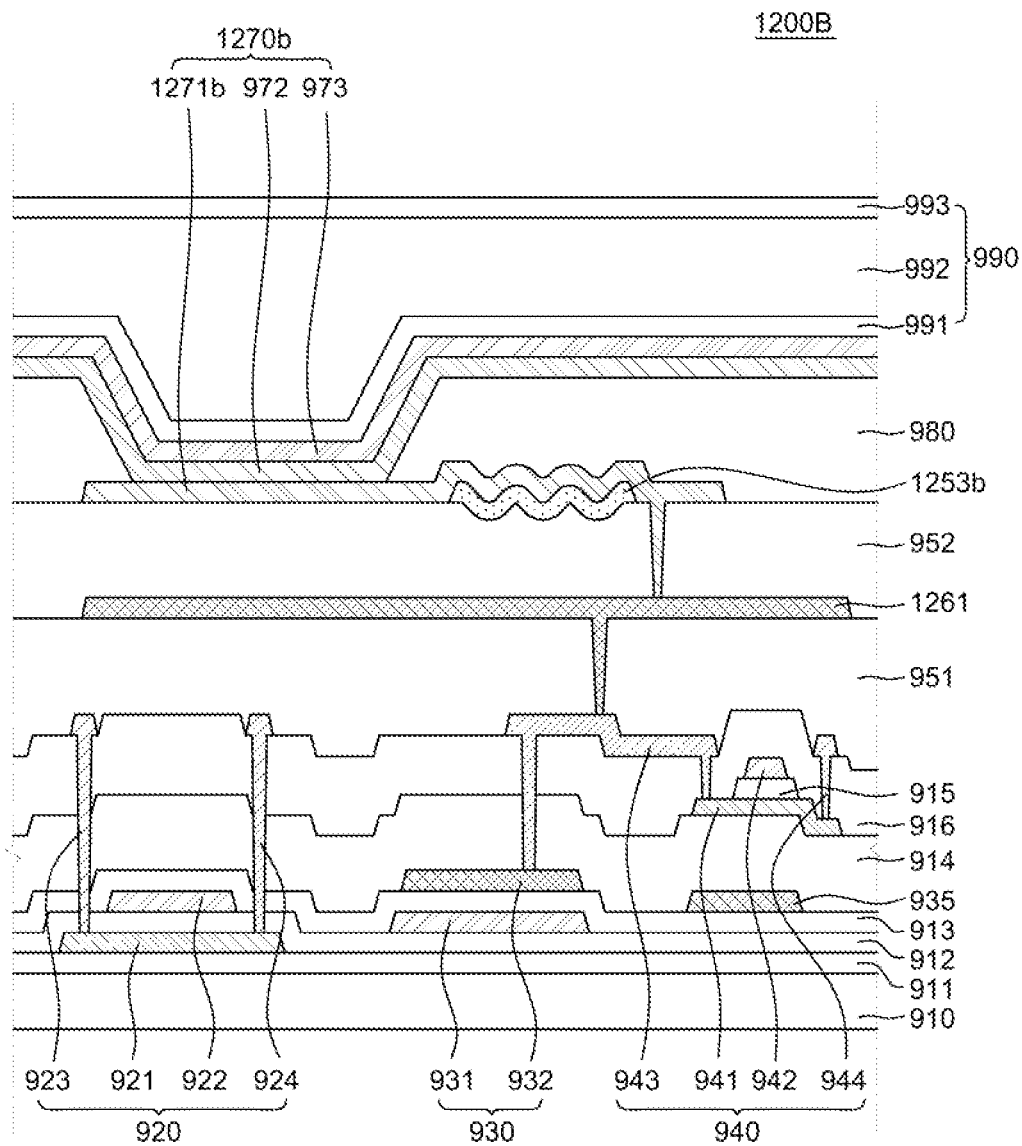

FIGS. 12A and 12B are cross-sectional views of display devices according to various aspects of the present disclosure. Display devices 1200A and 1200B illustrated in FIGS. 12A and 12B are substantially identical to the display device 900A illustrated in FIG. 9A, except for a connection electrode 1261, hydrogen blocking layers 1253a and 1253b, and light-emitting elements 1270a and 1270b. Therefore, repeated descriptions of the identical components will be omitted.

Referring to FIGS. 12A and 12B, the connection electrode 1261 may extend from a region in which the connection electrode 1261 overlaps with the second transistor 940 to a region in which the connection electrode 1261 overlaps with the light-emitting element 1270a or 1270b. The hydrogen blocking layer 1253a or 1253b may be disposed between the first electrode 1271a or 1271b of the light-emitting element 1270a or 1270b and the second planarization layer 952. In this case, the hydrogen blocking layer 1253a or 1253b may be disposed only in a region in which the hydrogen blocking layer 1253a or 1253b overlaps with the bank 980. The hydrogen blocking layers 1253a and 1253b may be made of the same material as the hydrogen blocking layer 917a illustrated in FIG. 9A.

According to the display device 1200A and 1200B according to the aspect of the present disclosure, the separate hydrogen blocking layer 1253a or 1253b may be disposed between the first electrode 1271a or 1271b and the second planarization layer 952, thereby suppressing the diffusion of hydrogen to the second transistor 940. In particular, because the hydrogen blocking layer 1253a or 1253b may be disposed close to the encapsulation unit 990, thereby further improving the effect of blocking hydrogen.

According to the display device 1200A and 1200B according to the aspect of the present disclosure, the connection electrode 1261, which serves as an auxiliary hydrogen blocking layer, may extend from a region in which the connection electrode 1261 overlaps with the second transistor 940 to a region in which the connection electrode 1261 overlaps with the light-emitting element 1270a or 1270b. Therefore, it is possible to suppress the diffusion of hydrogen that is diffused in the horizontal direction. In addition, an area of the connection electrode 1261 may increase, and the resistance of the display devices 1200A and 1200B may be reduced, thereby improving electric power consumption.

The hydrogen blocking layer 1253b of the display device 1200B according to the aspect of the present disclosure may include a concave-convex pattern. Therefore, an area of the hydrogen blocking layer 1253b may increase, thereby further improving the effect of blocking hydrogen.

In addition, the first electrode 1271b disposed on an upper portion of the hydrogen blocking layer 1253b may also include a concave-convex pattern. Therefore, an area of the first electrode 1271b may increase, thereby further reducing the overall resistance of the display device 1200B.

Figure 13A:
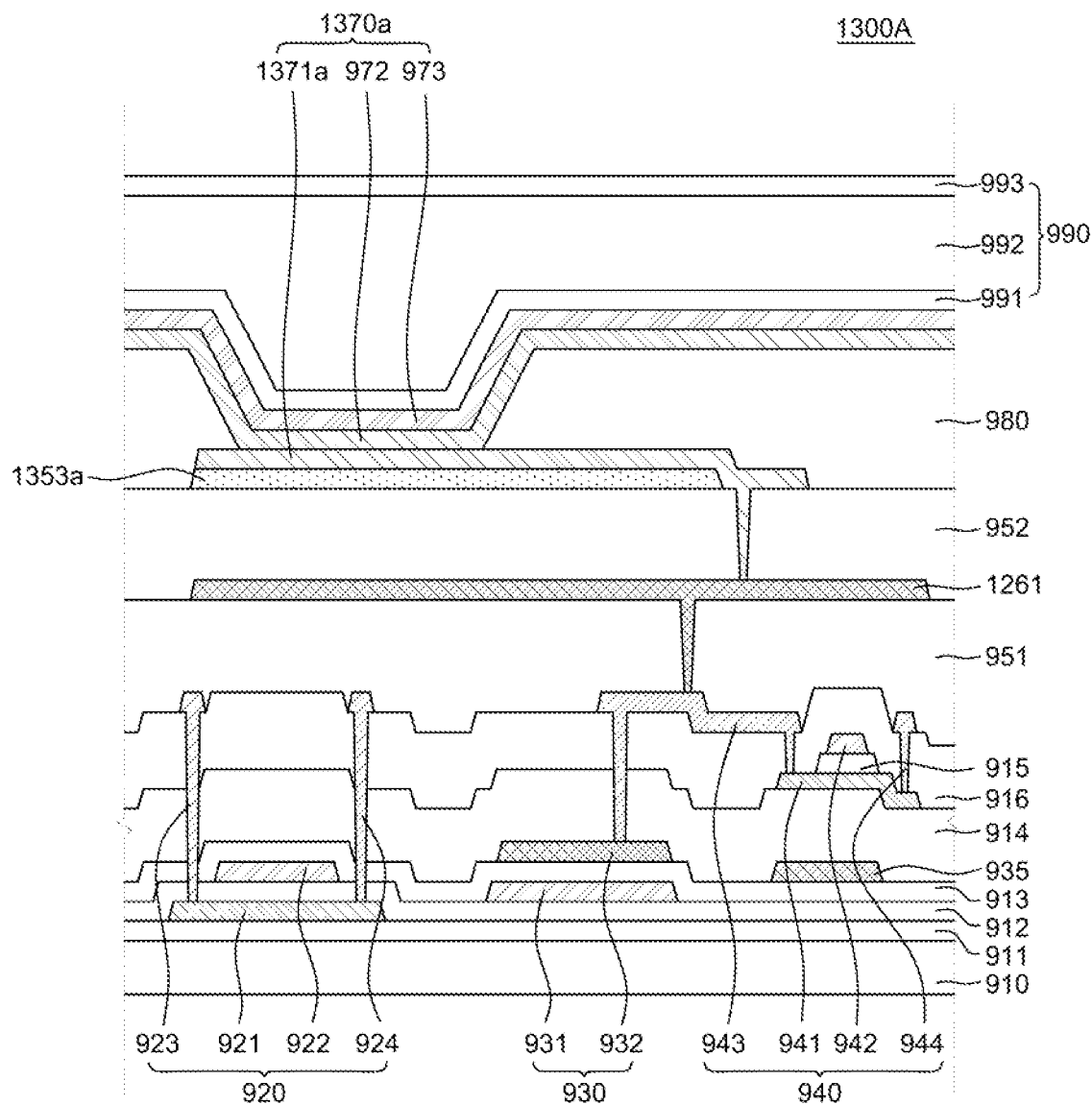
FIGS. 13A and 13B are cross-sectional views of display devices according to various aspects of the present disclosure.
Figure 13B:
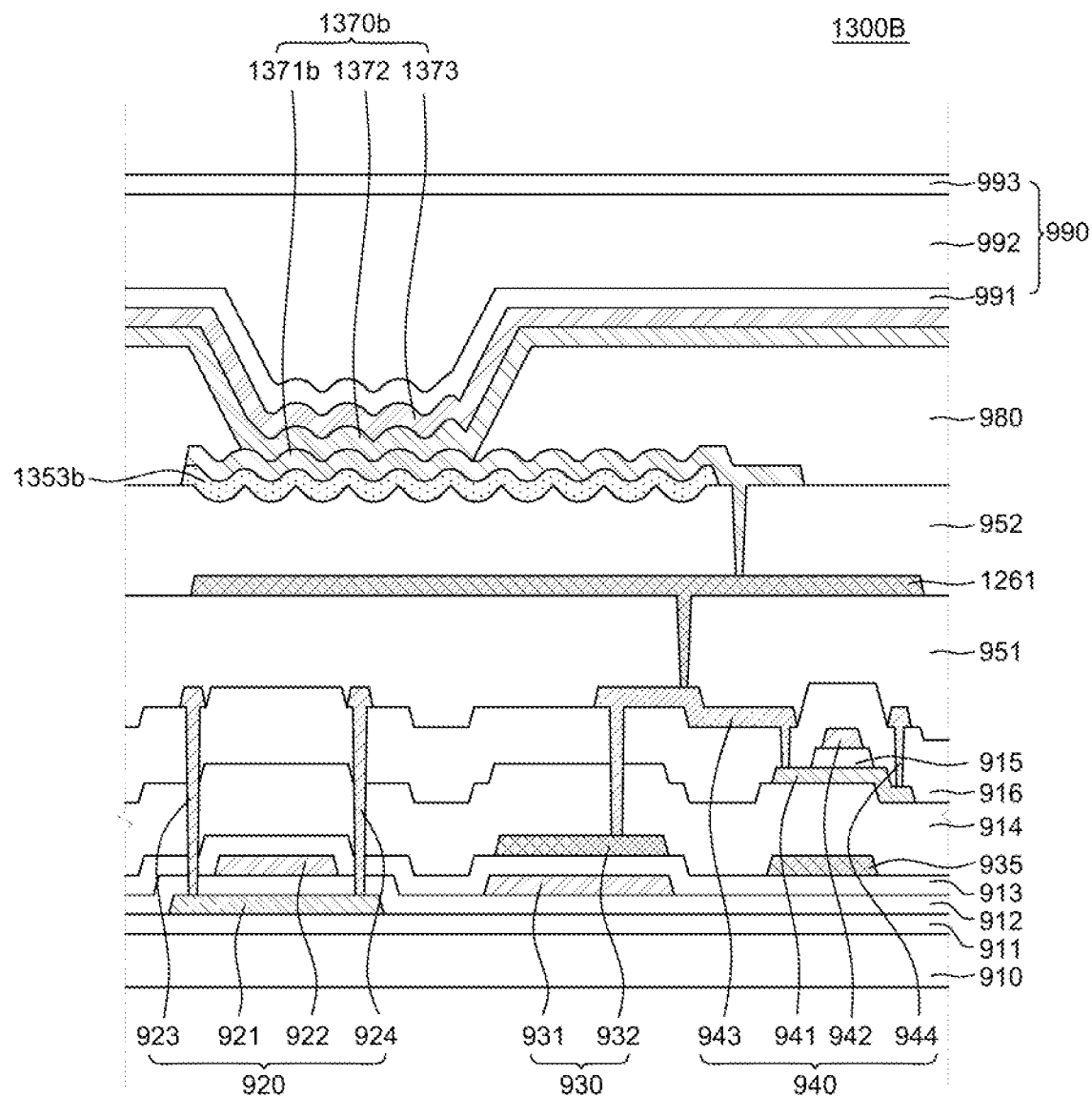

FIGS. 13A and 13B are cross-sectional views of display devices according to various aspects of the present disclosure. Display devices 1300A and 1300B illustrated in FIGS. 13A and 13B are substantially identical to the display devices 1200A and 1200B illustrated in FIGS. 12A and 12B, except for hydrogen blocking layers 1353a and 1353b and light-emitting elements 1370a and 1370b. Therefore, repeated descriptions of the identical components will be omitted.

Referring to FIGS. 13A and 13B, the hydrogen blocking layer 1353a or 1353b may be disposed between the second planarization layer 952 and the first electrode 1371a or 1371b of the light-emitting element 1370a or 1370b. In this case, the hydrogen blocking layer 1353a or 1353b may extend from a region in which the hydrogen blocking layer 1353a or 1353b overlaps with the bank 980 to a region in which the hydrogen blocking layer 1353a or 1353b overlaps with the light-emitting element 1370a or 1370b. The hydrogen blocking layers 1353a and 1353b may be made of the same material as the hydrogen blocking layer 917a illustrated in FIG. 9A.

According to the display devices 1300A and 1300B according to the aspect of the present disclosure, the hydrogen blocking layer 1353a or 1353b may be disposed to extend to the region corresponding to the light-emitting element 1370a or 1370b. Therefore, it is possible to increase an area in which the hydrogen blocking layer 1353a or 1353b may capture hydrogen. In particular, the hydrogen blocking layer 1353a or 1353b may be disposed between the second planarization layer 952 and the first electrode 1371a or 1371b and disposed close to the encapsulation unit 990. Therefore, the effect of the hydrogen blocking layer 1353a or 1353b for blocking hydrogen may be further improved.

The hydrogen blocking layer 1353b of the display device 1300B according to the aspect of the present disclosure may include a concave-convex pattern. Therefore, an area of the hydrogen blocking layer 1353b may increase, thereby further improving the effect of blocking hydrogen.

In addition, the first electrode 1371b, the light-emitting layer 1372, and the second electrode 1373 disposed over an upper portion of the hydrogen blocking layer 1353b may also include concave-convex patterns. Therefore, an area of the first electrode 1371b may increase, thereby further reducing the overall resistance of the display device 1300B. In addition, light directed toward the first electrode 1371b may be extracted by the concave-convex pattern of the first electrode 1371b, thereby improving efficiency in extracting light.

Figure 14A:
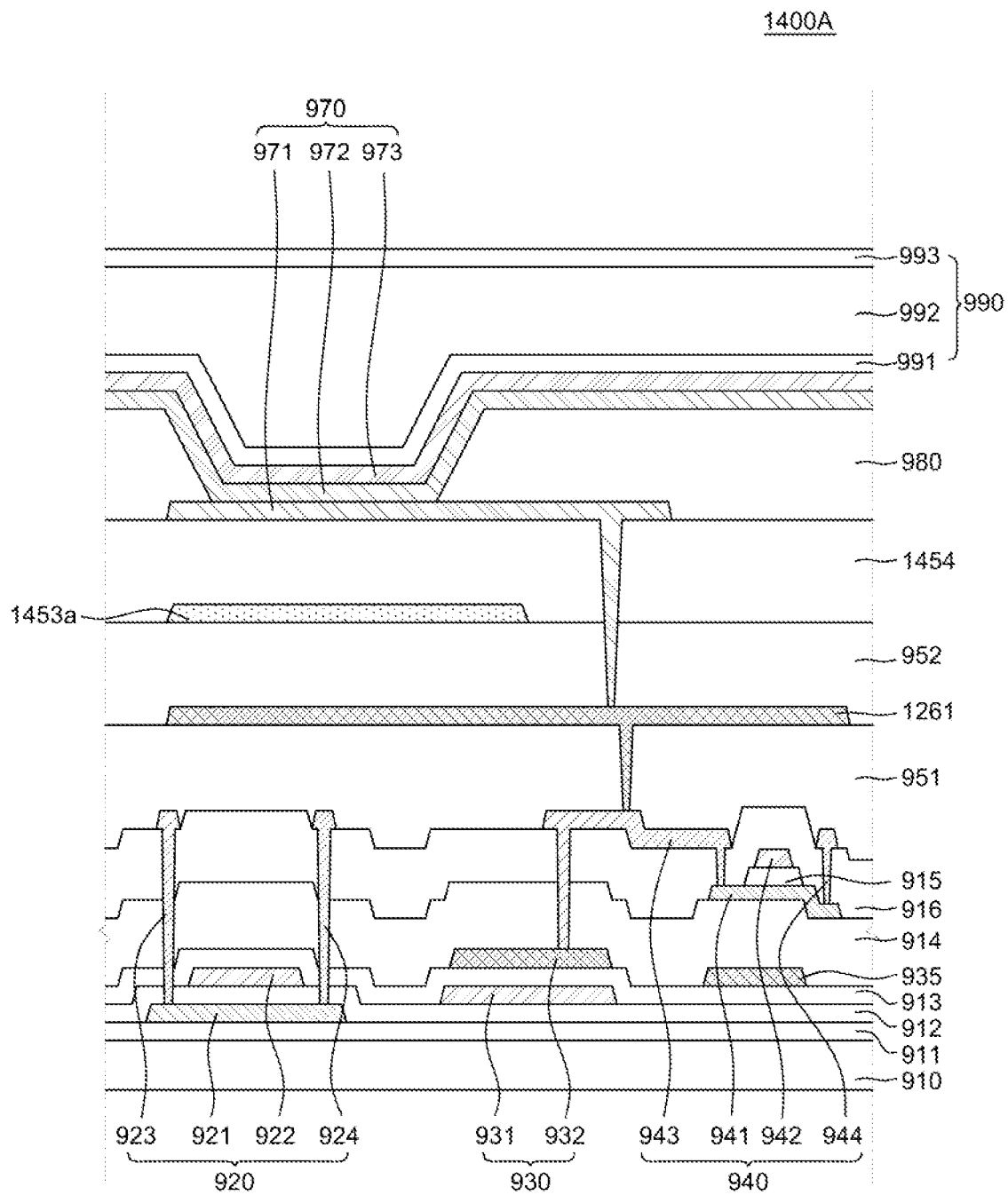
FIGS. 14A and 14B are cross-sectional views of display devices according to various aspects of the present disclosure.
Figure 14B:
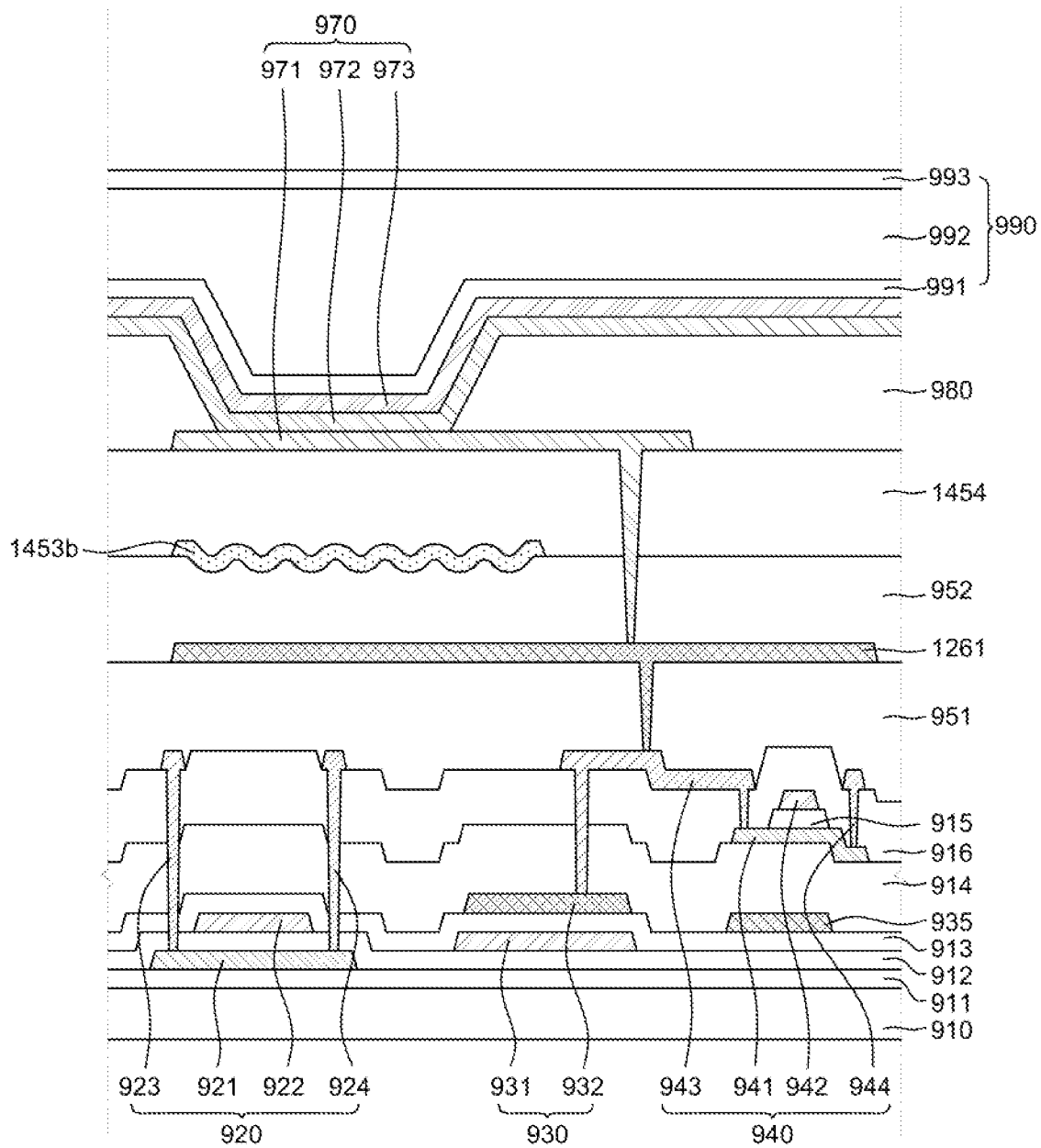

FIGS. 14A and 14B are cross-sectional views of display devices according to various aspects of the present disclosure. Display devices 1400A and 1400B illustrated in FIGS. 14A and 14B are substantially identical to the display devices 1200A and 1200B illustrated in FIGS. 12A and 12B, except for hydrogen blocking layers 1453a and 1453b and a third planarization layer 1454. Therefore, repeated descriptions of the identical components will be omitted.

Referring to FIGS. 14A and 14B, the third planarization layer 1454 is disposed on the second planarization layer 952. In this case, the hydrogen blocking layer 1453a or 1453b may be disposed between the second planarization layer 952 and the third planarization layer 1454. The hydrogen blocking layer 1453a or 1453b may be disposed in a region in which the hydrogen blocking layer 1453a or 1453b overlaps with the light-emitting element 970. The hydrogen blocking layers 1453a and 1453b may be made of the same material as the hydrogen blocking layer 917a illustrated in FIG. 9A.

According to the display devices 1400A and 1400B according to the aspect of the present disclosure, the hydrogen blocking layer 1453a or 1453b may block hydrogen that is diffused in the horizontal direction in the third planarization layer 1454. Therefore, it is possible to inhibit degradation of the second transistor 940.

The hydrogen blocking layer 1453a or 1453b may be disposed between the second planarization layer 952 and the third planarization layer 1454. In addition, the connection electrode 1261, which is an auxiliary hydrogen blocking layer, may be disposed between the first planarization layer 951 and the second planarization layer 952. That is, three planarization layers 951, 952, and 1454 may be provided, and the hydrogen blocking layer 1453a or 1453b and the connection electrode 1261 may be disposed between the planarization layers. Therefore, the hydrogen, which is diffused from the encapsulation unit 990, needs to pass through the three planarization layers 951, 952, and 1454, the hydrogen blocking layer 1453a or 1453b, and the connection electrode 1261. Therefore, since hydrogen is hardly diffused, the effect of blocking hydrogen may be improved.

The hydrogen blocking layer 1453b of the display device 1400B according to the aspect of the present disclosure may include a concave-convex pattern. Therefore, an area of the hydrogen blocking layer 1453b may increase, thereby further improving the effect of blocking hydrogen.

The exemplary aspects of the present disclosure can also be described as follows:

According to an aspect of the present disclosure, a display device includes: a transistor over a substrate; a planarization layer over the transistor; a light-emitting element over the planarization layer; and a plurality of insulating layers between the substrate and the light-emitting element, and at least one of the planarization layer and the plurality of insulating layers is a hydrogen blocking layer doped with a hydrogen capture material.

The hydrogen capture material may include one of boron (B), phosphorus (P), lithium (Li), sodium (Na), potassium (K), rubidium (Rb), cesium (Cs), magnesium (Mg), calcium (Ca), strontium (Sr), barium (Ba), scandium (Sc), yttrium (Y), lutetium (Lu), titanium (Ti), zirconium (Zr), hafnium (Hf), vanadium (V), niobium (Nb), tantalum (Ta), lanthanum (La), cerium (Ce), thorium (Th), praseodymium (Pr), protactinium (Pa), neodymium (Nd), uranium (U), neptunium (Np), samarium (Sm), plutonium (Pu), americium (Am), gadolinium (Gd), terbium (Tb), dysprosium (Dy), holmium (Ho), erbium (Er), thulium (Tm), and ytterbium (Yb).

The hydrogen blocking layer may be disposed between the transistor and the planarization layer.

The transistor may include: an active layer; a gate electrode; and a source electrode. The plurality of insulating layers may include: a gate insulating layer between the active layer and the gate electrode; and an interlayer insulating layer between the gate electrode and the source electrode. The active layer may include an oxide semiconductor.

The hydrogen blocking layer may be at least one of the interlayer insulating layer and the gate insulating layer.

The transistor may include a first transistor having low-temperature poly-silicon (LPTS), and a second transistor having an oxide semiconductor. A first interlayer insulating layer may be disposed between an active layer of the first transistor and a gate electrode of the first transistor. A second interlayer insulating layer may be disposed between an active layer of the second transistor and a gate electrode of the second transistor. The second interlayer insulating layer may be disposed over an upper portion of the first interlayer insulating layer. The hydrogen blocking layer may be the second interlayer insulating layer.

The planarization layer may include a first planarization layer and a second planarization layer. A connection electrode may be disposed between the first planarization layer and the second planarization layer and may electrically connect the transistor and the light-emitting element.

At least one of the first planarization layer and the second planarization layer may be the hydrogen blocking layer.

The hydrogen blocking layer may be disposed between the first planarization layer and the second planarization layer.

The hydrogen blocking layer may be disposed under the connection electrode between the first planarization layer and the second planarization layer.

The display device may further include a third planarization layer between the second planarization layer and the light-emitting element. The hydrogen blocking layer may be disposed between the second planarization layer and the third planarization layer.

The hydrogen blocking layer may be disposed between a first electrode of the light-emitting element and the planarization layer.

The hydrogen blocking layer may be disposed to overlap with the light-emitting element.

The hydrogen blocking layer may include a concave-convex pattern.

At least one of electrodes overlapping with the hydrogen blocking layer over the hydrogen blocking layer may include a concave-convex pattern.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a transistor disposed over a substrate;
   a planarization layer disposed over the transistor;
   a light-emitting element disposed over the planarization layer; and
   a plurality of insulating layers disposed between the substrate and the light-emitting element,
   wherein at least one of the planarization layer and the plurality of insulating layers is a hydrogen blocking layer doped with a hydrogen capture material, and
   wherein the hydrogen blocking layer includes a concave-convex pattern.

2. The display device of claim 1, wherein the hydrogen capture material includes one of boron (B), phosphorus (P), lithium (Li), sodium (Na), potassium (K), rubidium (Rb), cesium (Cs), magnesium (Mg), calcium (Ca), strontium (Sr), barium (Ba), scandium (Sc), yttrium (Y), lutetium (Lu), titanium (Ti), zirconium (Zr), hafnium (Hf), vanadium (V), niobium (Nb), tantalum (Ta), lanthanum (La), cerium (Ce), thorium (Th), praseodymium (Pr), protactinium (Pa), neodymium (Nd), uranium (U), neptunium (Np), samarium (Sm), plutonium (Pu), americium (Am), gadolinium (Gd), terbium (Tb), dysprosium (Dy), holmium (Ho), erbium (Er), thulium (Tm), and ytterbium (Yb).

3. The display device of claim 1, wherein the hydrogen blocking layer is disposed between the transistor and the planarization layer.

4. The display device of claim 1, wherein the transistor comprises:
   an active layer;
   a gate electrode; and
   a source electrode,
   wherein the plurality of insulating layers comprises a gate insulating layer between the active layer and the gate electrode, and an interlayer insulating layer between the gate electrode and the source electrode, and
   wherein the active layer includes an oxide semiconductor.

5. The display device of claim 4, wherein the hydrogen blocking layer is at least one of the interlayer insulating layer and the gate insulating layer.

6. The display device of claim 1, wherein the transistor includes a first transistor having low-temperature poly-silicon (LPTS), and a second transistor having an oxide semiconductor,
   wherein a first interlayer insulating layer is disposed between an active layer of the first transistor and a gate electrode of the first transistor,
   wherein a second interlayer insulating layer is disposed between an active layer of the second transistor and a gate electrode of the second transistor,
   wherein the second interlayer insulating layer is disposed over an upper portion of the first interlayer insulating layer, and
   wherein the hydrogen blocking layer is the second interlayer insulating layer.

7. The display device of claim 1, wherein the planarization layer includes a first planarization layer and a second planarization layer.

8. The display device of claim 7, further comprising a connection electrode disposed between the first planarization layer and the second planarization layer and electrically connects the transistor and the light-emitting element.

9. The display device of claim 8, wherein the hydrogen blocking layer is disposed under the connection electrode between the first planarization layer and the second planarization layer.

10. The display device of claim 7, wherein at least one of the first planarization layer and the second planarization layer is the hydrogen blocking layer.

11. The display device of claim 7, wherein the hydrogen blocking layer is disposed between the first planarization layer and the second planarization layer.

12. The display device of claim 1, wherein at least one of electrodes overlapping with the hydrogen blocking layer over the hydrogen blocking layer includes a concave-convex pattern.

13. A display device comprising:
- a transistor disposed over a substrate;
- a planarization layer disposed over the transistor;
- a light-emitting element disposed over the planarization layer; and
- a plurality of insulating layers disposed between the substrate and the light-emitting element,
- wherein at least one of the planarization layer and the plurality of insulating layers is a hydrogen blocking layer doped with a hydrogen capture material,
- wherein the planarization layer includes a first planarization layer, a second planarization layer and a third planarization layer between the second planarization layer and the light-emitting element, and
- wherein the hydrogen blocking layer is disposed between the second planarization layer and the third planarization layer.

14. The display device of claim 1, wherein the hydrogen blocking layer is disposed between a first electrode of the light-emitting element and the planarization layer.

15. The display device of claim 14, wherein the hydrogen blocking layer overlaps with the light-emitting element.

* * * * *